(12) United States Patent
Wunnicke et al.

(10) Patent No.: US 7,615,444 B2
(45) Date of Patent: Nov. 10, 2009

(54) METHOD FOR FORMING A CAPACITOR STRUCTURE

(75) Inventors: Odo Wunnicke, Dresden (DE); Peter Moll, Dresden (DE); Kristin Schupke, Dresden (DE)

(73) Assignee: Qimonda AG, Munich (DE)

( * ) Notice: Subject to any disclaimer, the term of this patent is extended or adjusted under 35 U.S.C. 154(b) by 245 days.

(21) Appl. No.: 11/477,581

(22) Filed: Jun. 29, 2006

(65) Prior Publication Data

US 2008/0003740 A1   Jan. 3, 2008

(51) Int. Cl.
*H01L 21/8242* (2006.01)
(52) U.S. Cl. ............... 438/253; 257/309; 257/E21.648; 257/E21.019
(58) Field of Classification Search .......... 438/253, 438/243, 244; 257/E21.019, E21.648
See application file for complete search history.

(56) References Cited

U.S. PATENT DOCUMENTS 7,344,953 B2* 3/2008 Hecht et al. ............. 438/386
2004/0077143 A1   4/2004 Lee et al.
2004/0175884 A1   9/2004 Kang et al.
2005/0026361 A1*  2/2005 Graettinger et al. ....... 438/253
2006/0086962 A1*  4/2006 Wu ....................... 257/306
2006/0192239 A1*  8/2006 Patraw et al. ............ 257/301
2007/0001207 A1*  1/2007 Graettinger et al. ....... 257/302

OTHER PUBLICATIONS

German Office Action dated May 23, 2007.

* cited by examiner

*Primary Examiner*—Jerome Jackson, Jr.
*Assistant Examiner*—Paul A Budd
(74) *Attorney, Agent, or Firm*—Eschweiler & Associates, LLC

(57) ABSTRACT

A method for forming a capacitor structure, according to which the following consecutive steps are executed: providing a substrate having on its surface contact pads and a dielectric mold provided with at least one trench leaving exposed the contact pads; forming a first conductive layer on side walls of the trench in a top region of the trench the conductive layer being without contact to the contact pads; depositing a first dielectric layer; depositing a second conductive layer on the contact pad and on the side walls of the trench; depositing a second dielectric layer; depositing a third conductive layer; and forming a vertical plug interconnecting the first conductive layer and the third conductive layer.

11 Claims, 25 Drawing Sheets

METHOD FOR FORMING A CAPACITOR STRUCTURE

BACKGROUND OF THE INVENTION

1. Field of the Invention

The present invention relates to a method for forming a capacitor structure. Further, the present invention relates to a capacitor structure in particular a capacitor structure formed on a semi-conductor substrate.

2. Description of the Related Art

The memory capacity of DRAM memory devices per unit area shall be increased for technical and economical reasons. The DRAM memory device comprises a plurality of memory cells. Each of them can store a single information unit in its capacitor. An increase of the memory capacity per unit area can be achieved by reducing the horizontal dimensions, i.e. in the plane of the DRAM memory device, of these capacitors.

For a reliable operation of the memory cells, the electric capacity of the capacitors must be kept above a minimal value. As the electric capacity is proportional to both the vertical and the lateral dimensions, the vertical dimension of the capacitors is increased when horizontal dimensions are reduced. Nowadays, the capacitors have a diameter in the range of 100 nm or less and a height of several micrometers.

A manufacturing process known to the inventor starts by forming a free standing first electrode on a substrate surface. The first electrode has basically the same height as the later formed capacitor, and may have a diameter even less than the capacitor. The mechanical stability of this first electrode is therefore very limited. Thus, some of the first electrode collapse or are deformed before or during the continued manufacturing process.

BRIEF SUMMARY OF THE INVENTION

A method for forming a capacitor structure, according to which the following consecutive steps are executed:
  providing a substrate having on its surface contact pads and a dielectric mold provided with at least one trench leaving exposed the contact pads;
  forming a first conductive layer on side walls of the trench in a top region of the trench the conductive layer being without contact to the contact pads;
  depositing a first dielectric layer;
  depositing a second conductive layer on the contact pad and on the side walls of the trench;
  depositing a second dielectric layer;
  depositing a third conductive layer; and
  forming a vertical plug interconnecting the first conductive layer and the third conductive layer.

In the inventive method, the formed electrodes, i.e. the conductive layers, are mechanically supported by the dielectric mold all the time. This enhances the mechanical stability of the electrodes during the manufacturing process.

The inventive capacitor structure on a contact pad comprises
  a first electrode of a tube shape extending vertically upwards and being arranged in electric contact with the contact pad;
  a second electrode being arranged around the first electrode and being isolated from the first electrode and the contact pad by a first dielectric layer;
  a third electrode being arranged along an inner side of the first electrode, spanning horizontally an upper end of the first electrode and being isolated from the first electrode and the contact pad by a second dielectric layer; and
  a vertical plug contacting the first electrode and the third electrode.

In an embodiment of the invention the forming of the first conductive layer includes the steps of: depositing the first conductive layer; depositing a masking layer on the first conductive layer selectively in the top region of the trench leaving free a bottom region of the trench; etching the first conductive layer in the bottom region of the trench; and removing the masking layer.

In an embodiment of the invention the masking layer is formed by a chemical deposition method, at least one chemical reactant of the chemical deposition method having a concentration, which is decreasing in the trench in a direction towards the contact pads and is approximately zero in the bottom region.

In an embodiment of the invention the first conductive layer is formed by a chemical deposition method, at least one chemical reactant of the chemical deposition method having a concentration, which is decreasing in the trench in a direction towards the contact pads and is approximately zero in the bottom region.

In an embodiment of the invention before the first dielectric layer is deposited an isotropic etching step enlarges a diameter of the bottom region of the trench.

In an embodiment of the invention before the second conductive layer is deposited the following steps are executed:

a sacrificial layer is deposited onto the first dielectric layer, the sacrificial layer having a first thickness above the contact pad and a second thickness above the dielectric mold, the first thickness being smaller than the second thickness; anisotropically etching the sacrificial layer until the sacrificial layer is removed above the contact pads; and selectively etching the first dielectric layer for exposing the contact pad.

In an embodiment of the invention the sacrificial layer is formed by a chemical deposition method, at least one chemical reactant of the chemical deposition method having a concentration, which is decreasing in the trench in a direction towards the contact pads and is approximately zero in the bottom region.

In an embodiment of the invention the second conductive layer is removed from the top surface of the dielectric mold.

In an embodiment of the invention the second conductive layer is removed by a chemical polishing method.

In an embodiment of the invention before the second conductive layer is deposited a further dielectric mold having a further trench is formed on top of the dielectric mold the further trench being arranged in line to the trench.

In an embodiment of the invention the vertical plug is formed through the further dielectric mold for connecting the first conductive layer and the third conductive layer.

Preferred embodiments of the method for forming capacitor structures according to the invention will be described below with reference to the attached figures for explaining the features of the invention.

DESCRIPTION OF THE PREFERRED EMBODIMENTS

Figure 1:
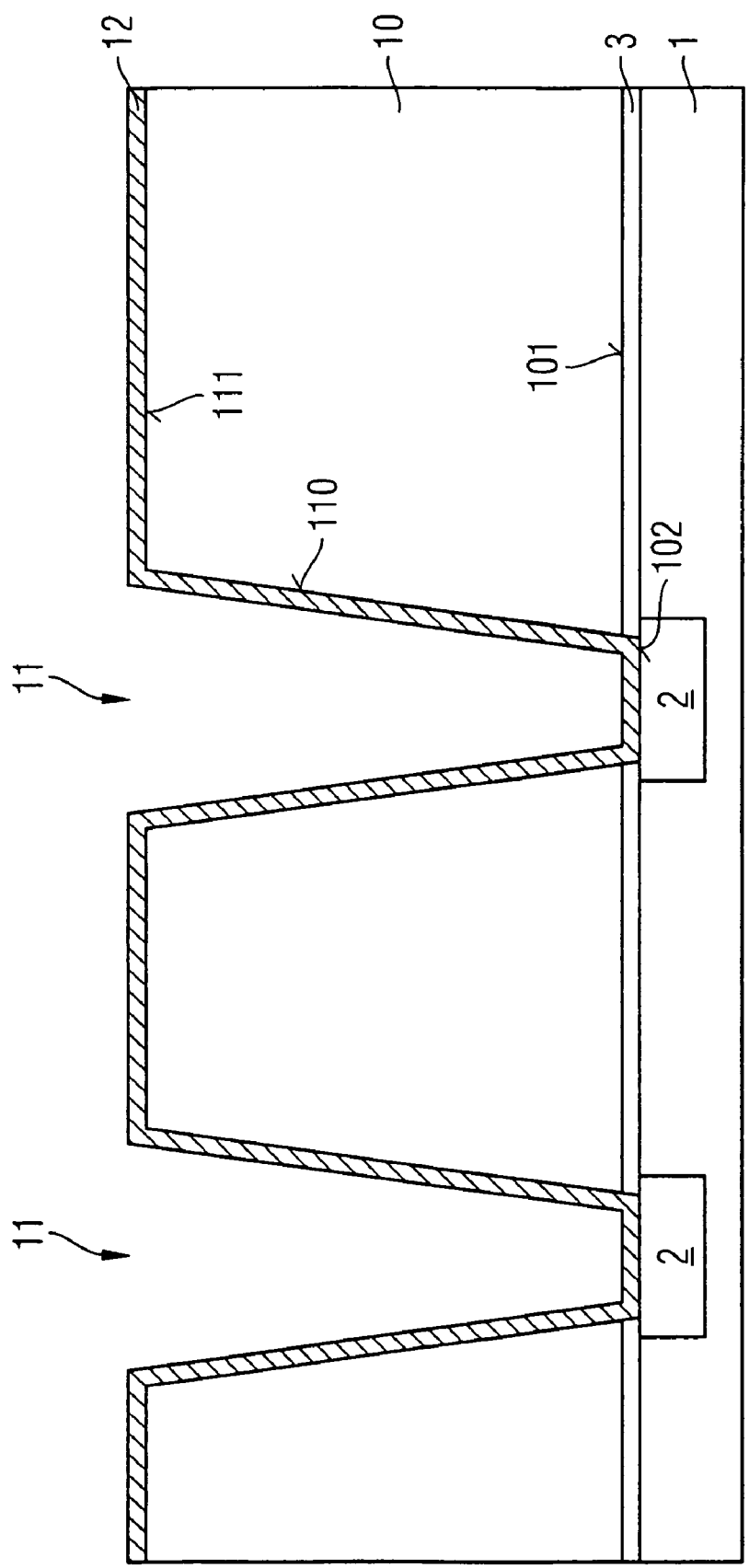
FIGS. 1 to 15 are local sections for illustrating gradually a method for forming a capacitor structure according to a first embodiment.

Identical reference signs in the FIGS. 1 to 24 designate identical or similar elements.

A first embodiment of the present invention will be illustrated along with FIGS. 1 to 15.

A substrate 1 is provided, e.g. a semiconductor substrate, in which a plurality of electronic circuits may be enclosed. These electronic circuits can be contacted via the contact pads 2, which are provided on a surface 101 of the substrate 1, silicon nitride layer 3 or any other etch stop or protective layer may coat the substrate surface 101.

In a first step a dielectric mold 10 is formed on the substrate surface 101. Preferably, the dielectric mold 10 is of one piece. In some refinements the dielectric mold 10 comprises several layers composed of different materials. Chemical vapour deposition techniques (CVD) can be used to deposit silicon oxide, etc. Other deposition techniques may be a spinning on of a glass or glass precursors. The thickness or vertical dimension of the dielectric mold 10 is at least several micrometers.

Trenches 11 are formed into the dielectric mold 10 above the contact pads 2. The depth of the trenches 11 is equal to the thickness of the dielectric mold 10. Thus the contact pads 2 become at least partially exposed.

A first conductive layer 12 is deposited on the top surface 111 of the dielectric mold, the side walls 110 of the trenches 11 and the surface 102 of the contact pads 2. The material of the first conductive layer 12 may be of titan nitride or carbon or silicon.

The first conductive layer 12 is still in contact with the contact pads 2. Along with the FIGS. 2 to 4 a preferred method is demonstrated for isolating the first conductive layer 12 from the contact pads 2.

Figure 2:
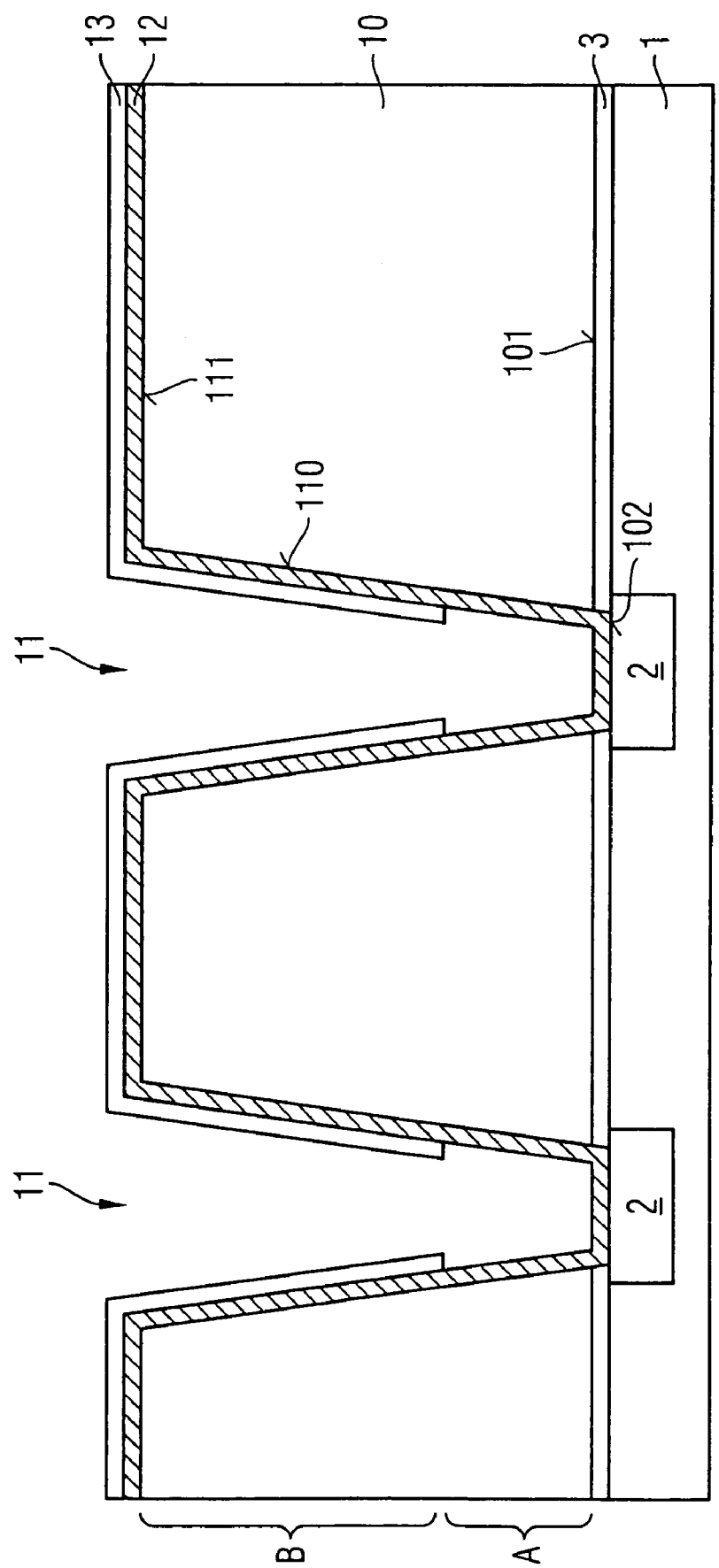

A masking layer 13 is deposited by an atomic layer deposition (ALD) technique (FIG. 2). The conditions in the reaction chamber are selected such that a concentration of the reactant gas decreases in the trench 11 in direction to the substrate surface 101. In a top region B of the trench 11 a concentration of reactant gases is sufficient to deposit the masking layer 13. In a bottom region, which is closer to the substrate surface 101 than the top region, the concentration of the reactant gases is insufficient for a formation of the masking layer 13. This leads to coverage of the first conductive layer 12 by the masking layer 13 only in a top region B of the trench and on the top surface 111 of the dielectric mold 10. In contrast thereto the first conductive layer 12 remains exposed in the bottom region A of the trench 11.

It is sufficient that at least some of the reactant gases do not reach the bottom region, e.g. one precursor (FIG. 2).

Figure 3:
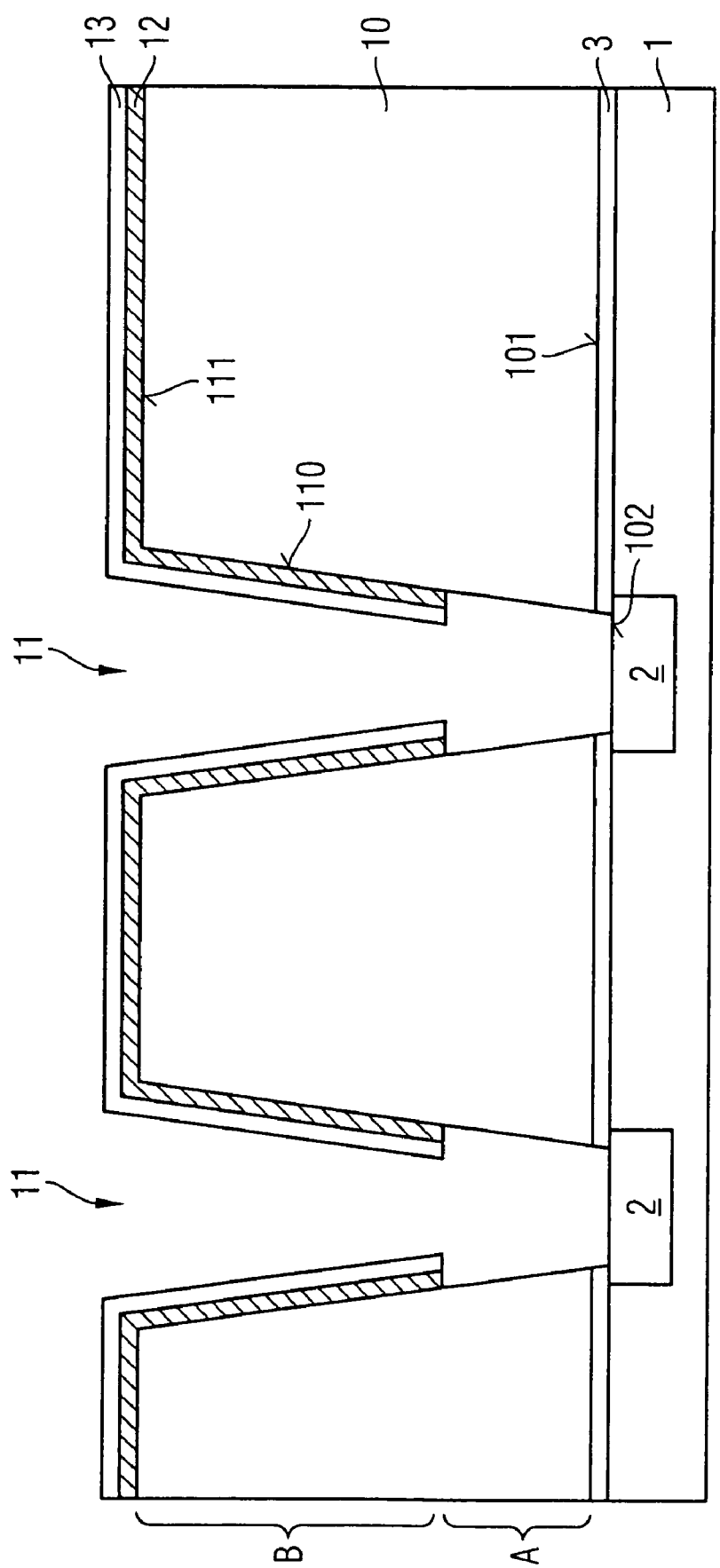

The first conductive layer 12 is selectively etched in the bottom region A (FIG. 3). Wet etching techniques are preferred.

The selectivity of the wet etching can be enhanced by pre-processing the masking layer 13. A high temperature annealing process is found to be useful, in particular when the masking layer 13 is formed of aluminium oxide. Temperatures above 850° C. for about 20 seconds reveal good results.

Figure 4:
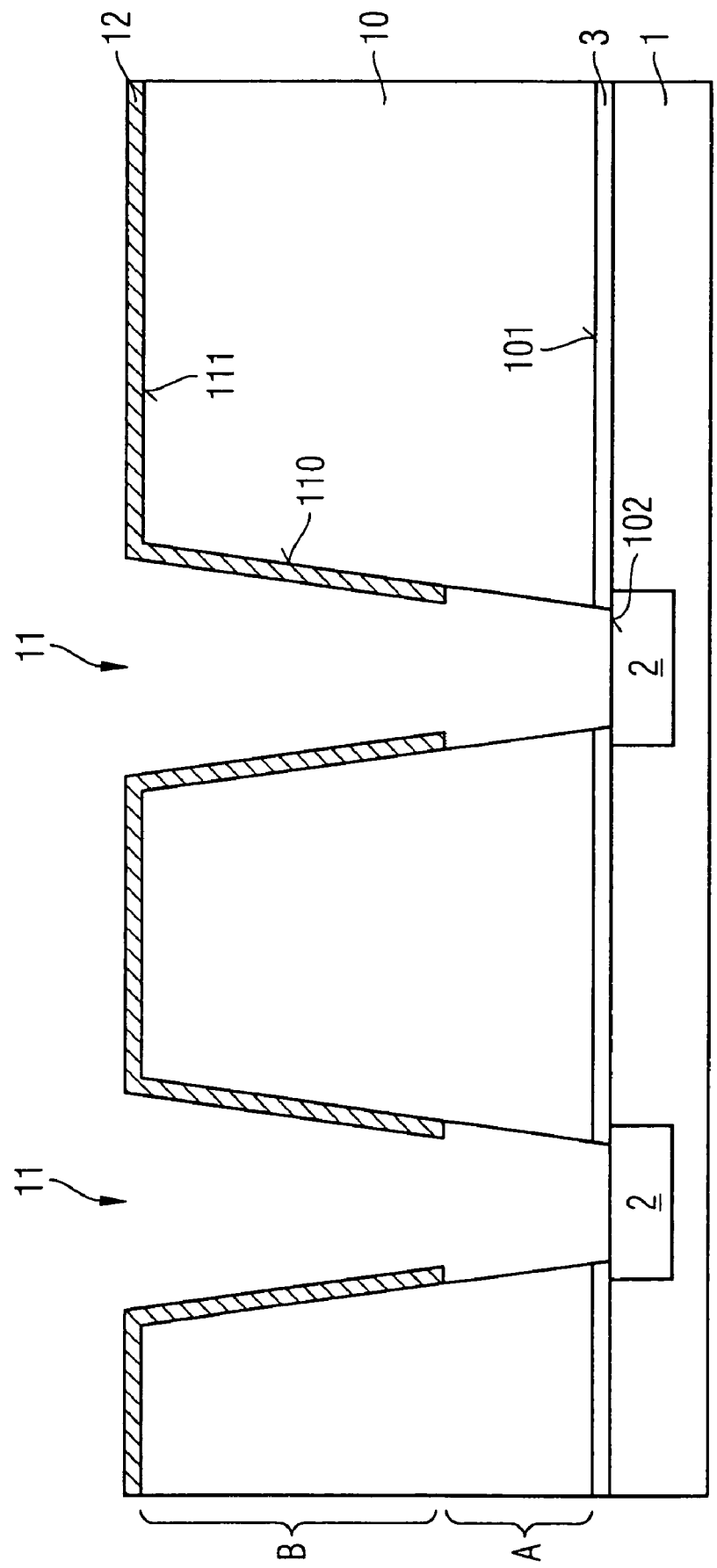

Finally, the masking layer 13 is stripped of (FIG. 4). Now, the first conductive layer 12 is isolated from the contact pad 2.

Figure 5:
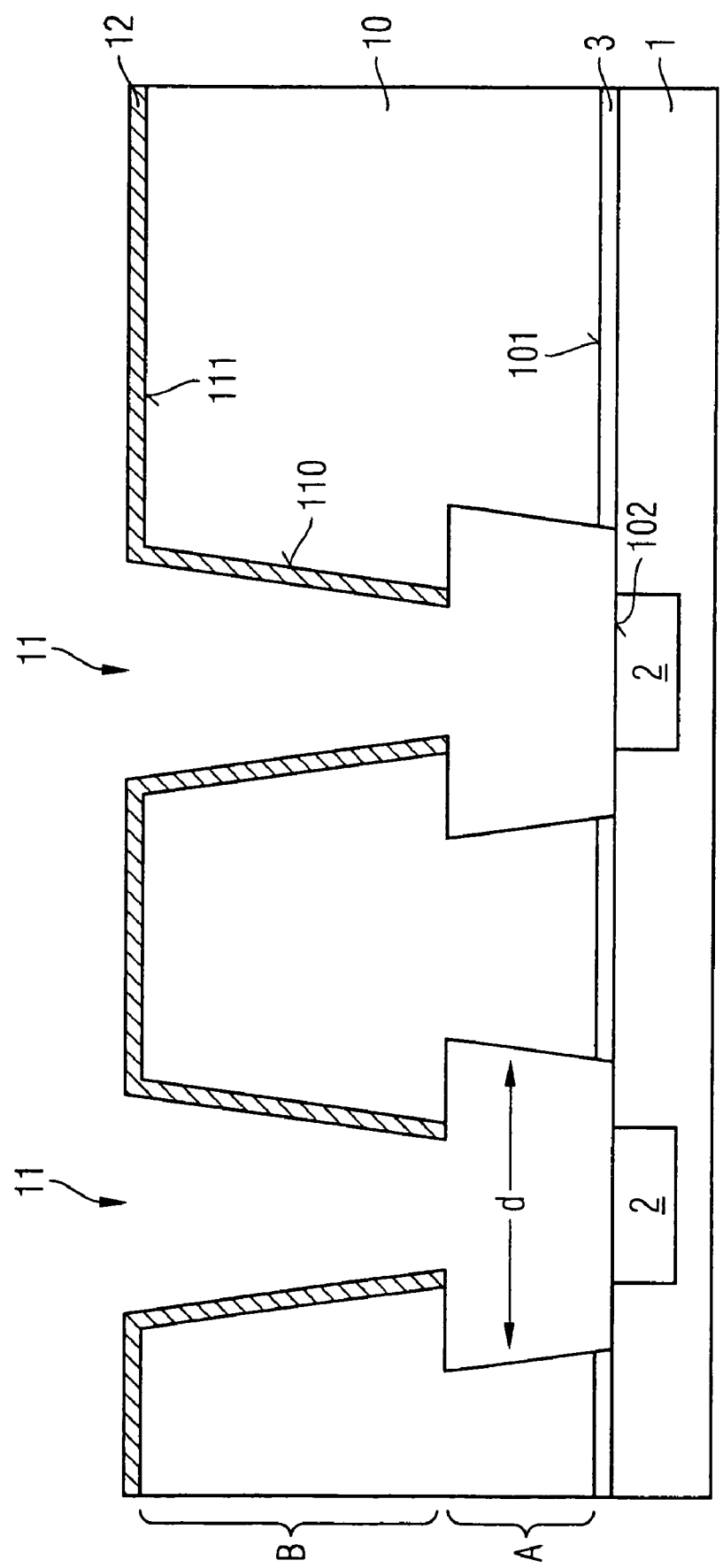
Figure 6:
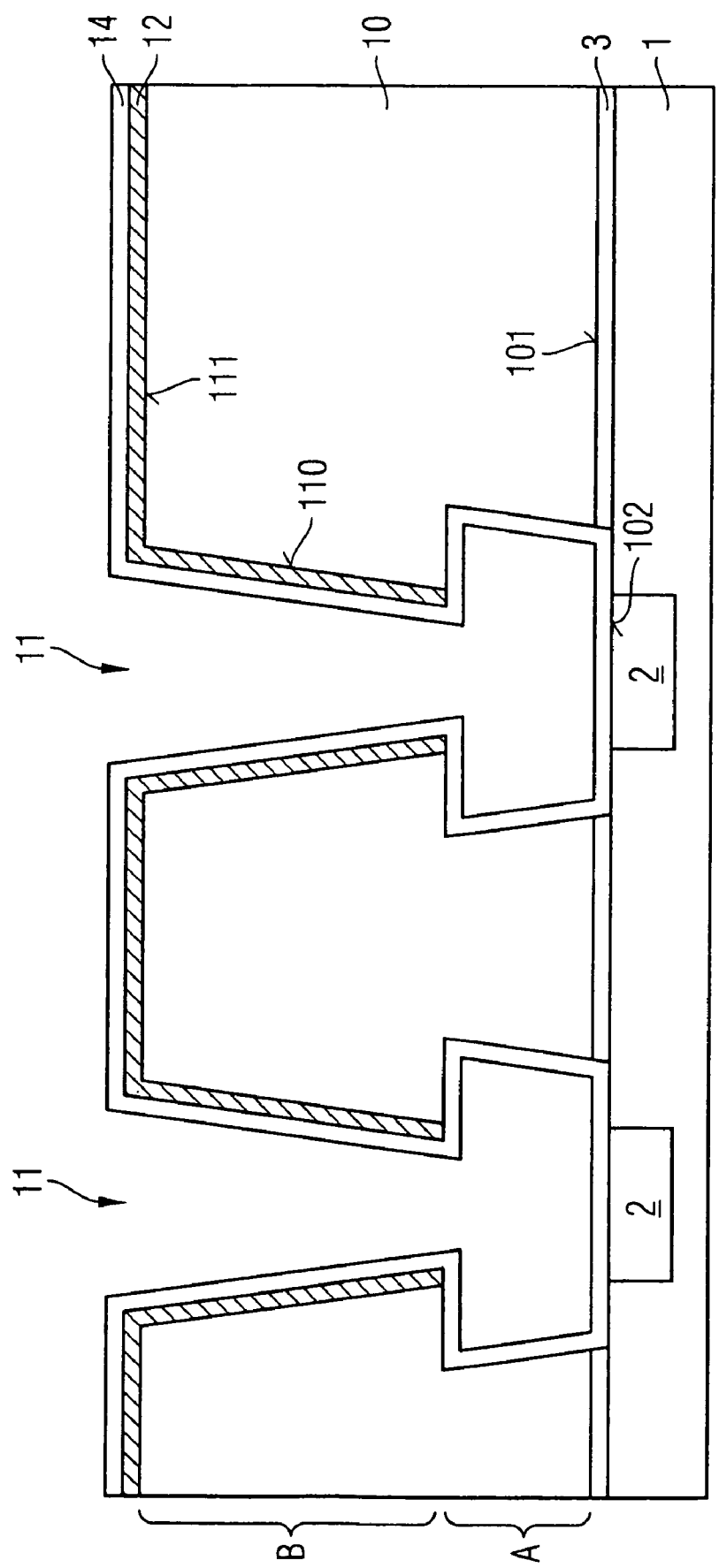

Along with FIG. 5 an optional step is illustrated. The effective surface of the later formed capacitor can be increased by etching the side walls 110 in the bottom region A. Preferably, the side walls 110 are etched isotropically. Thus, the diameter d of the trench 11 in the bottom region A is increased. This isotropic etching may be effected before the stripping of the masking layer 13, as well.

The description of the first embodiment continues after the optional step of etching the bottom region A. It is understood, however, that the above demonstrated steps can be effected without the optional step applied, as well.

Now, a first dielectric layer 14 is deposited onto the first conductive layer 12 and on the side walls 110 of the bottom region A. The used dielectric materials may comprise at least one of zircon oxide, hafnium oxide, zircon silicon oxide (ZrSiO), zircon aluminium oxide (ZrAlO), hafnium silicon oxide (HfAlO), aluminium oxide (AlO), and doped ZrO/HfO. A doping agent may be a rare earth metal. A combination of the enlisted materials can be used as dielectric material, too. Due to the deposition technique the first dielectric layer 14 is applied onto the contact pads 2, too. Along with FIG. 7 to 10 it is illustrated how to remove the first dielectric layer 14 at least partly from the contact pads 2.

Figure 7:
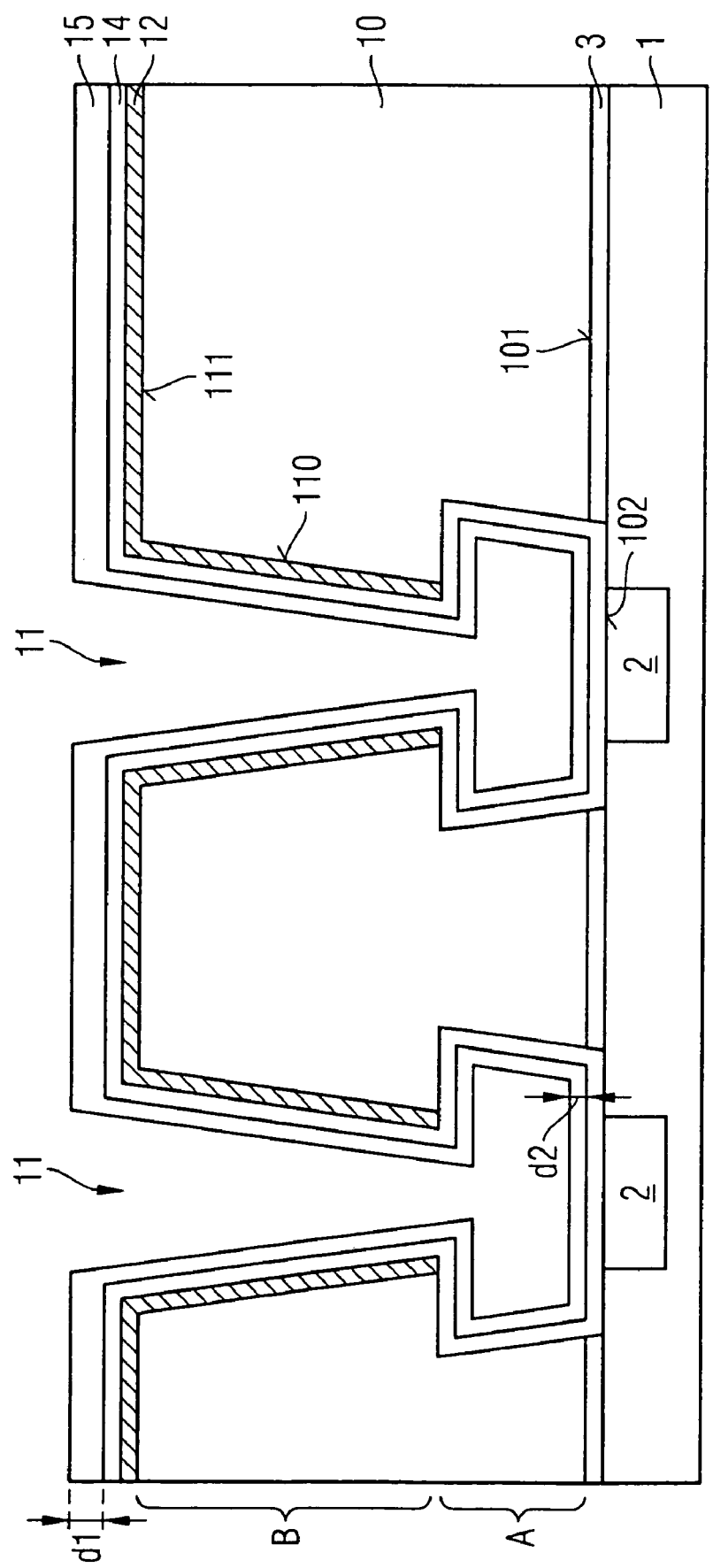
Figure 8:
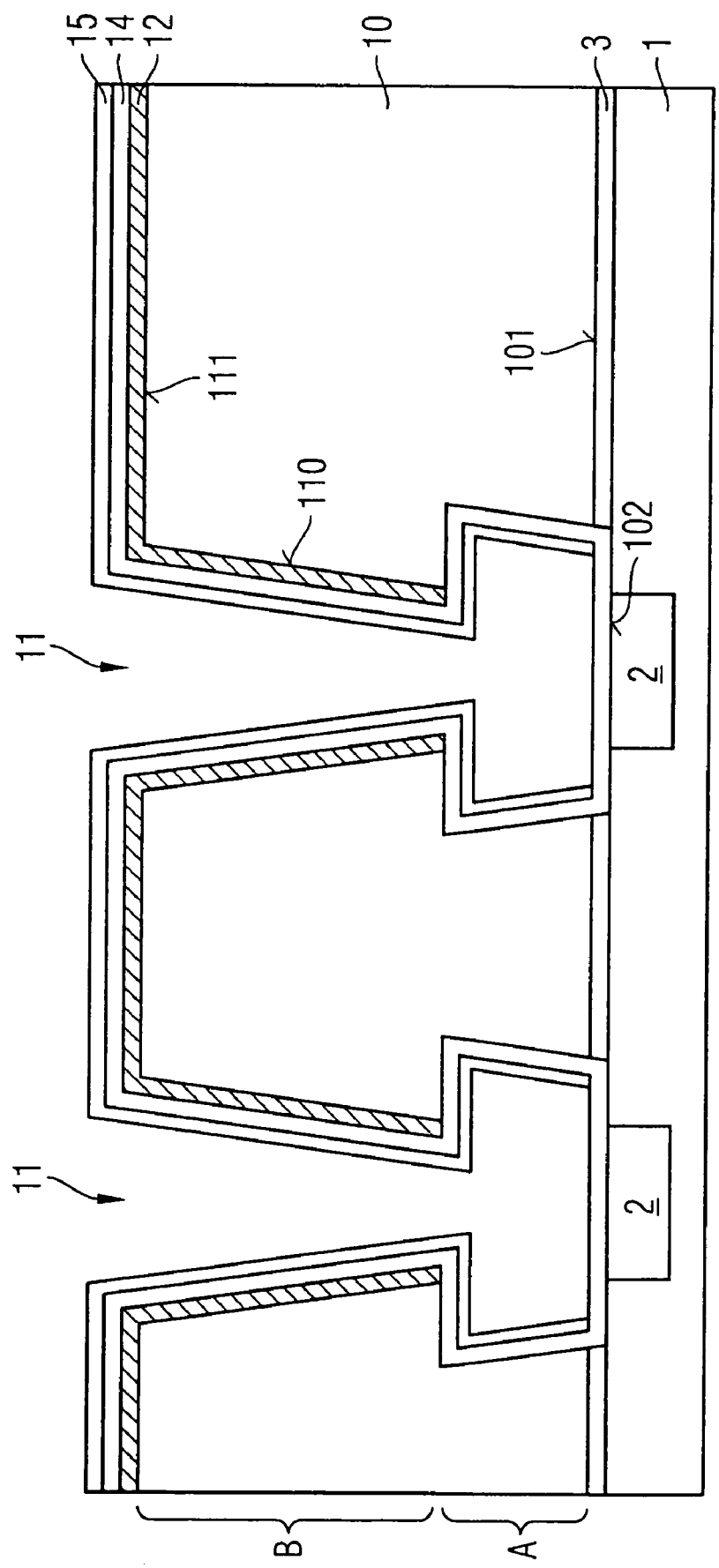

At first, a sacrificial layer 15 is applied over the whole structure, for instance by a suitable chemical vapour deposition process (FIG. 7). The thickness of the sacrificial layer 15 is not uniform. The thickness d1 on the top surface 111 of the dielectric mold 10 is larger then the thickness d2 of the sacrificial layer 15 above the contact pad 2. Such an inhomogeneous thickness can be achieved by an inhomogeneous deposition technique. By controlling the deposition rates and/or the reactant gas concentrations in the reaction chamber a higher growth rate may be achieved on the top surface of the mold 10 compared to growth rate inside the trench 11.

The sacrificial layer 15 is etched by an anisotropic etching process. The anisotropic etching process is stopped, when the sacrificial layer 15 is removed from the surface 102 of the contact pad 2. At this moment, there remains still some of the sacrificial layer 15 on top of the dielectric mold 10. Thus, the first dielectric layer 14 is only exposed close to the contact pad 2.

Figure 9:
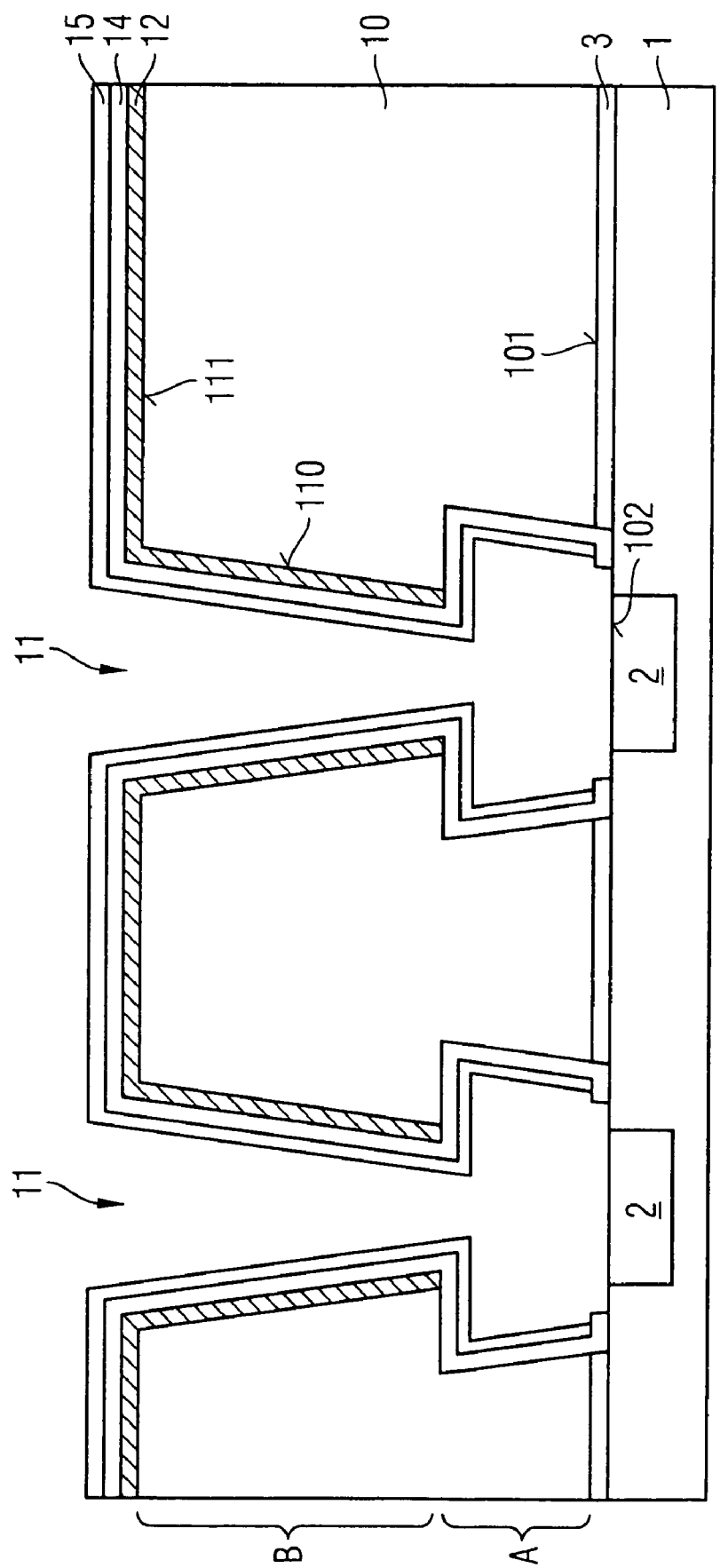
Figure 10:
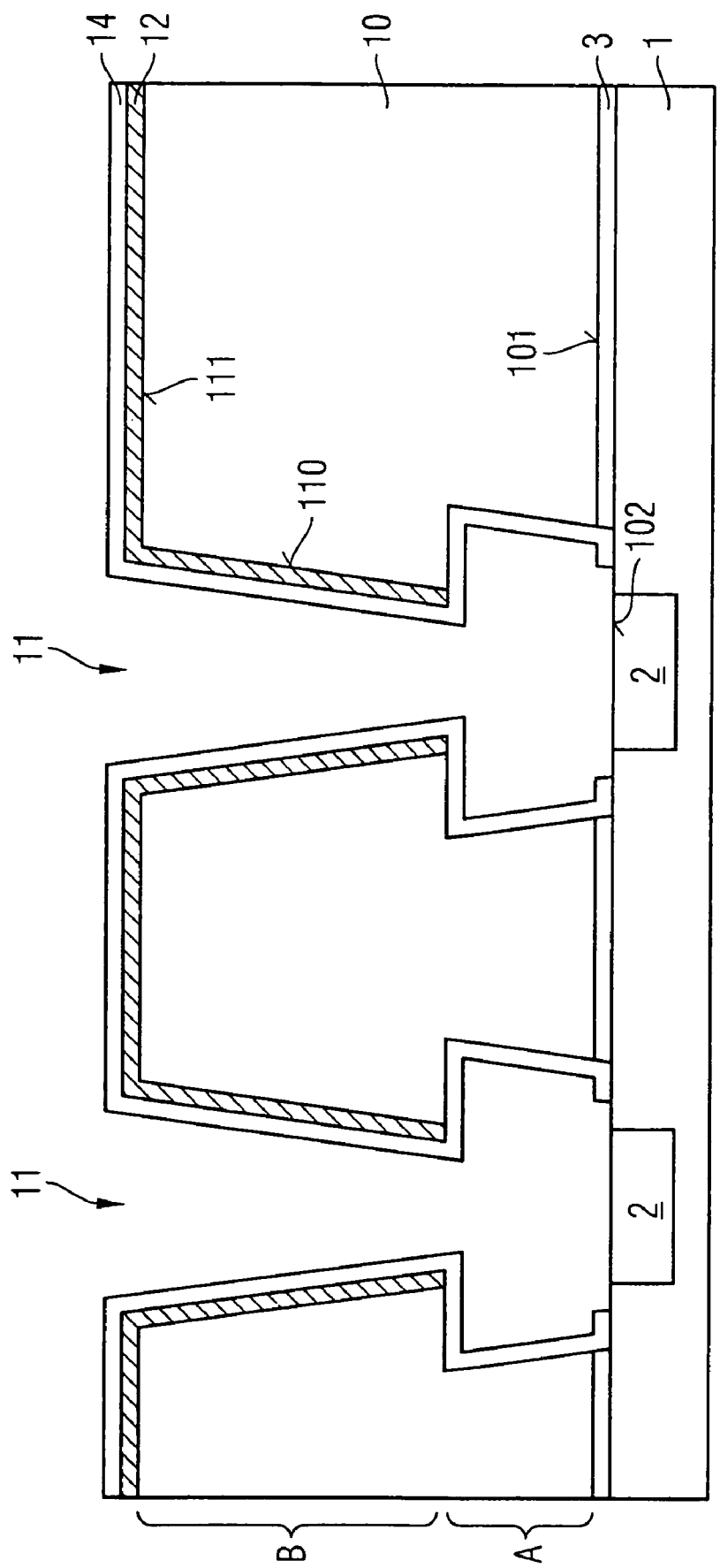

By a selective etching process the first conductive layer 14 is removed from the contact pad 2 (FIG. 9). Afterwards the sacrificial layer 15 is stripped off (FIG. 10). Now, the contact pads 2 are again at least partly exposed.

Figure 11:
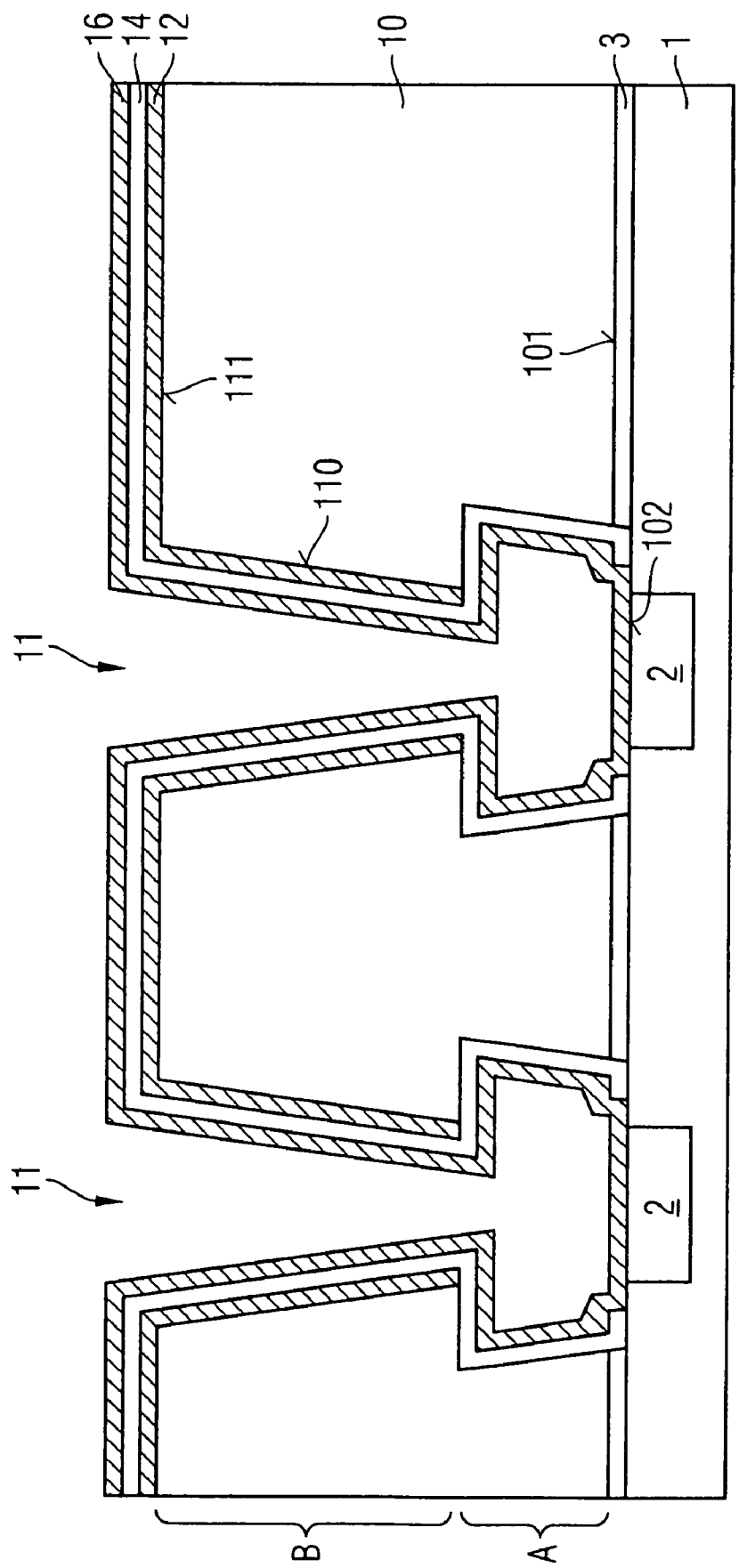

A second conductive layer 16 is deposited onto the dielectric layer 14 and the exposed contact pads 2. In contrast to the first conductive layer 12 the second conductive layer 16 remains in contact with the contact pad 2 (FIG. 11).

Figure 12:
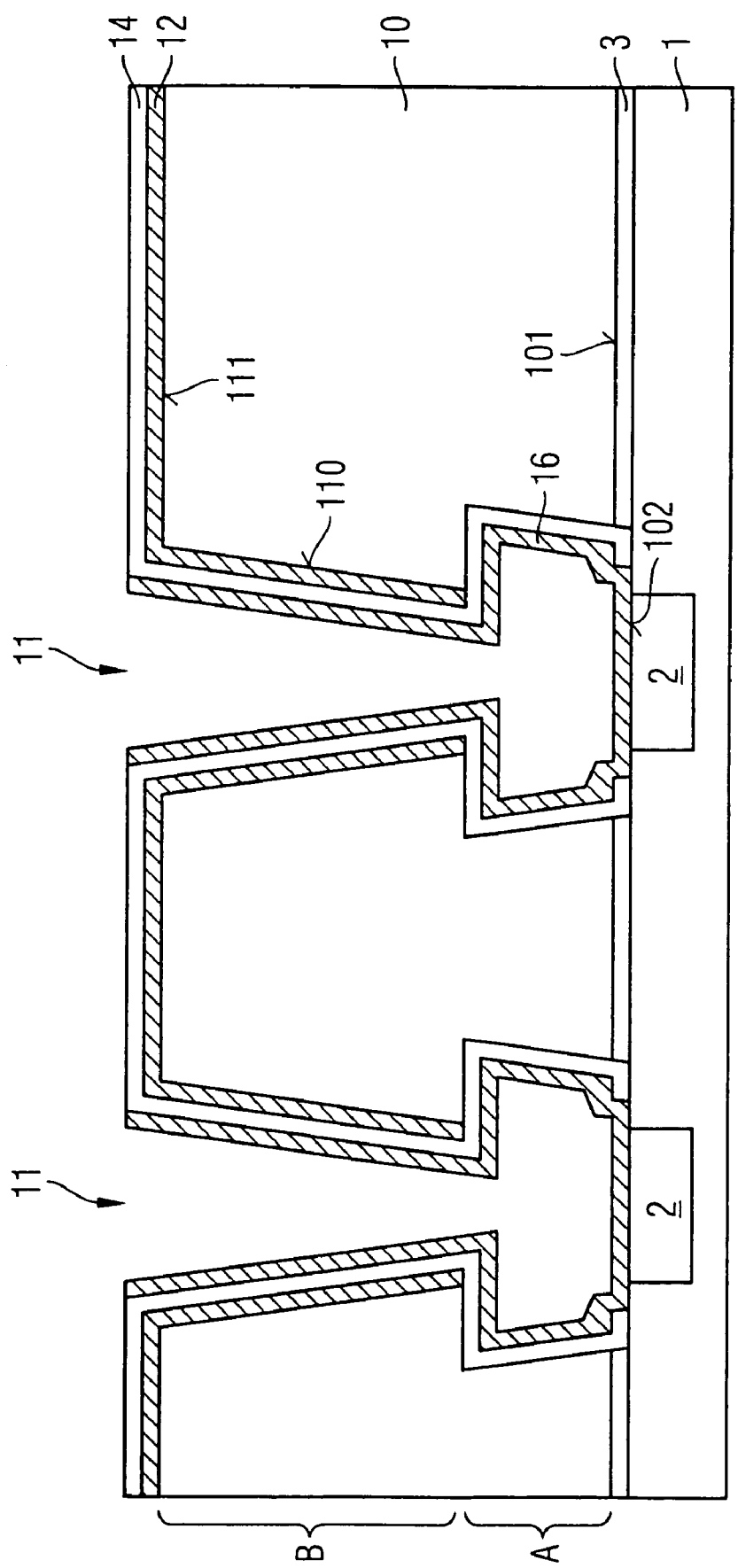
Figure 13:
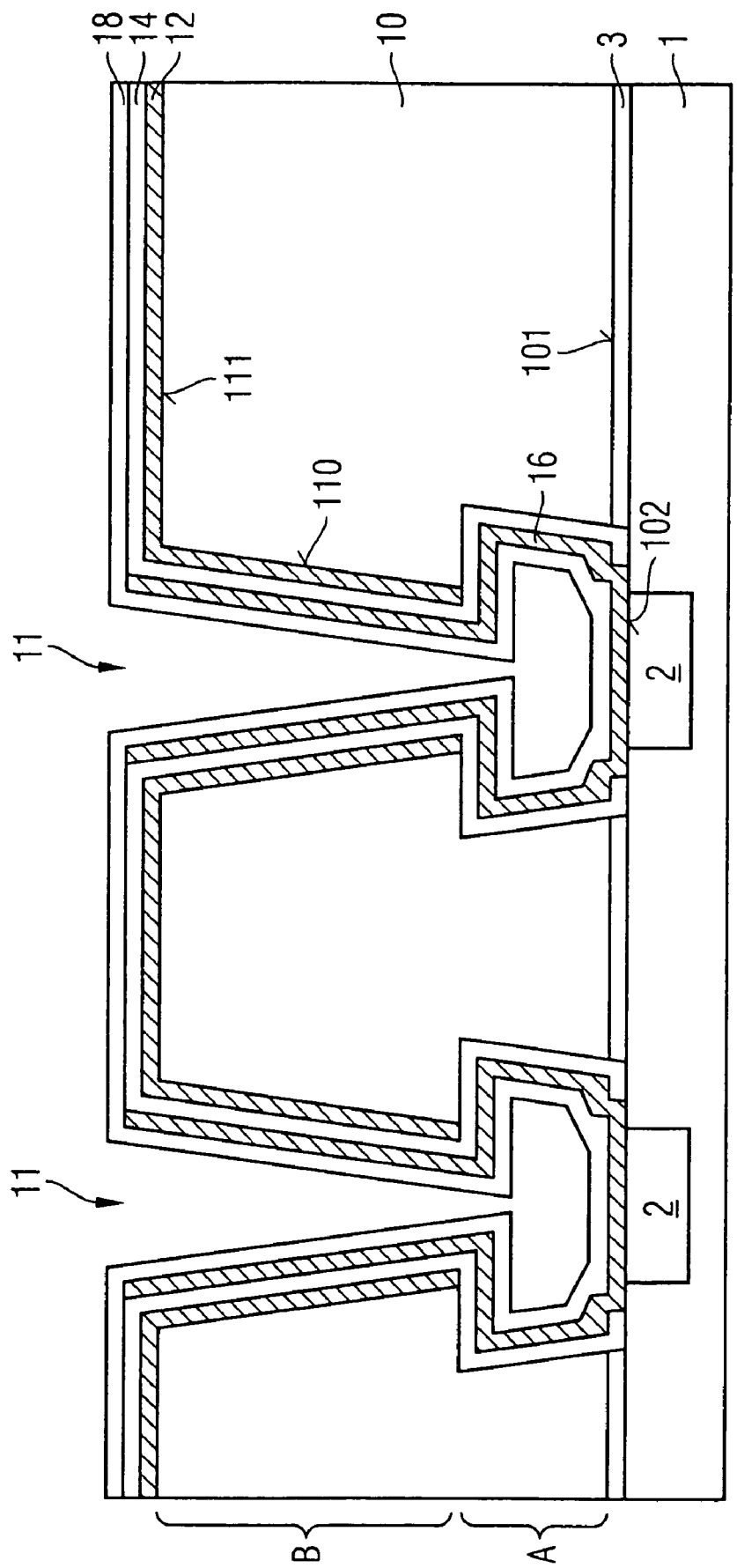
Figure 14:
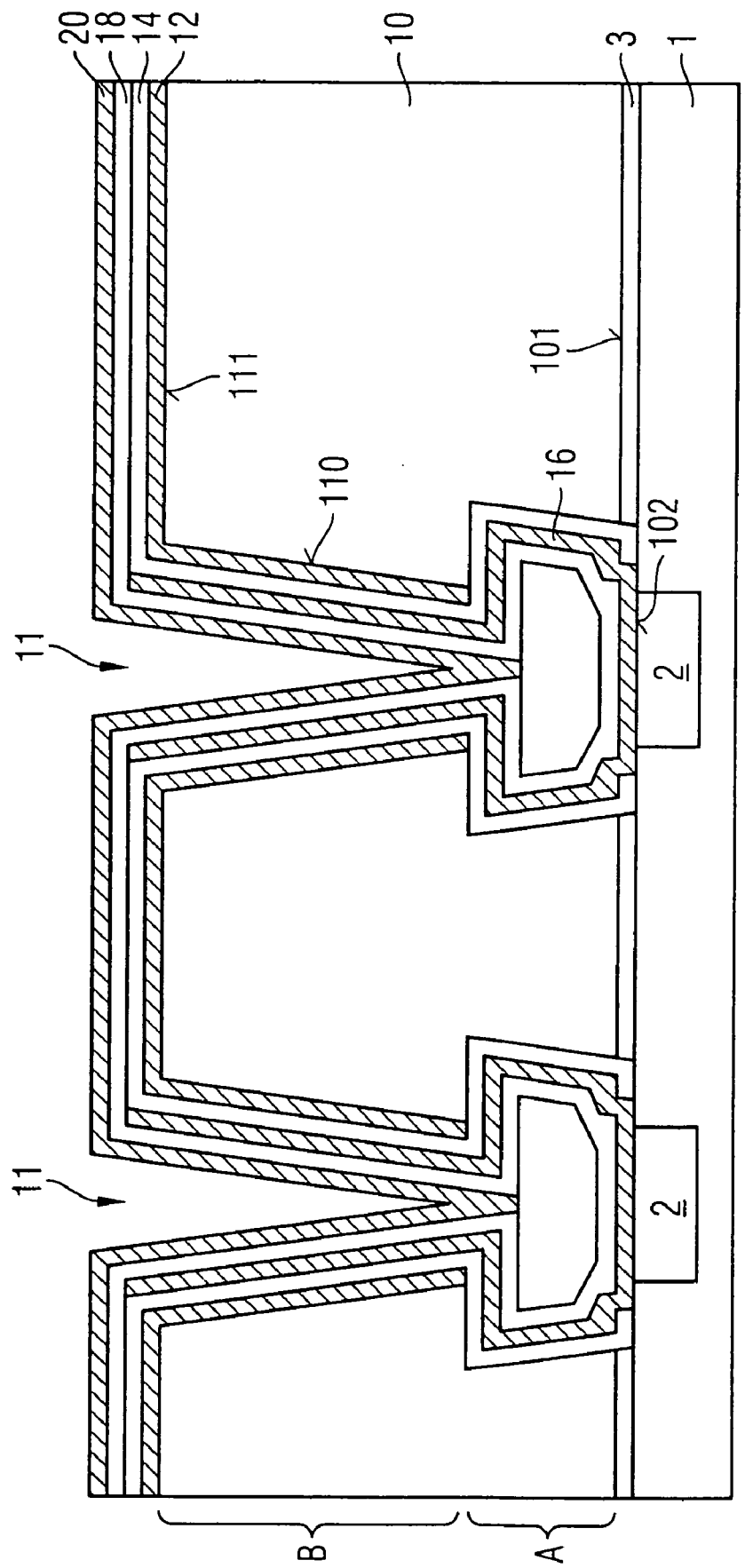

A mechanical polishing step removes the second conductive layer 16 from the top surface 111 of the dielectric mold 10 (FIG. 12). In a next step a second dielectric layer 18 is deposited (FIG. 13) and a third conductive layer 20 is deposited afterwards (FIG. 14).

Figure 15:
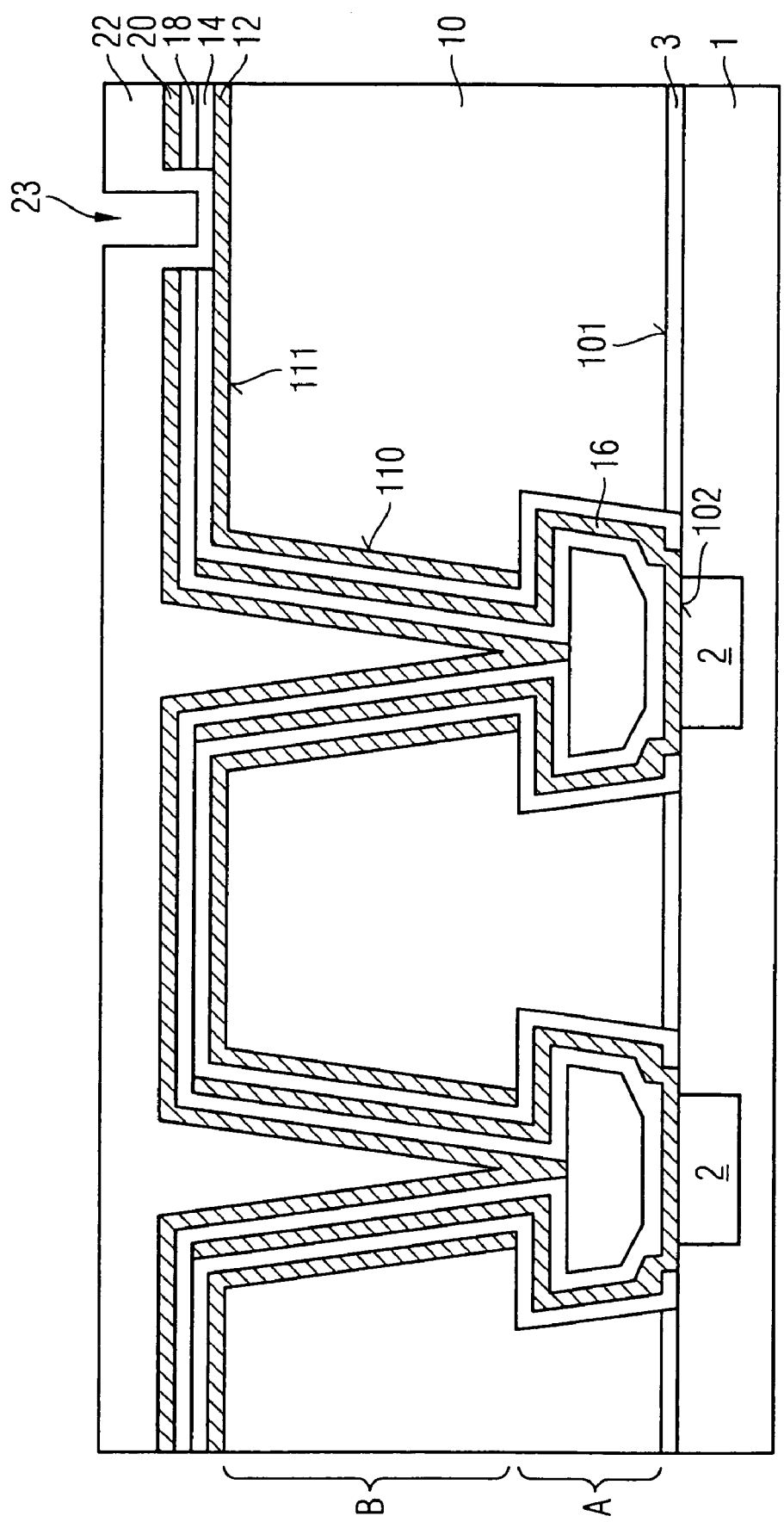

Then a contact layer 22 of a conductive material is applied over the whole structure. Additionally, a plug 23 is formed through the first and second dielectric layer 14, 18 in order to connect the first conductive layer 12 and the third conductive layer 20 (FIG. 15). The contact layer 22 may be applied by a chemical vapour deposition and be made of tungsten. Preferably, the vertical plug 23 is formed at an array edge of a plurality of capacitors.

The second conductive layer 16 forms a tube shaped electrode 16. This tube shaped electrode 16 is in electric contact to the contact pad 2. The other two conductive layers 12, 20 are forming a second electrode 12, 20, which is arranged at the outer and the inner side of the tube shaped electrode 16. The inner and the outer part of the counter electrode 12, 20 are connected via the vertical plug 23. The vertical plug 23 is horizontally displaced to the tube shaped electrode 16.

Figure 16:
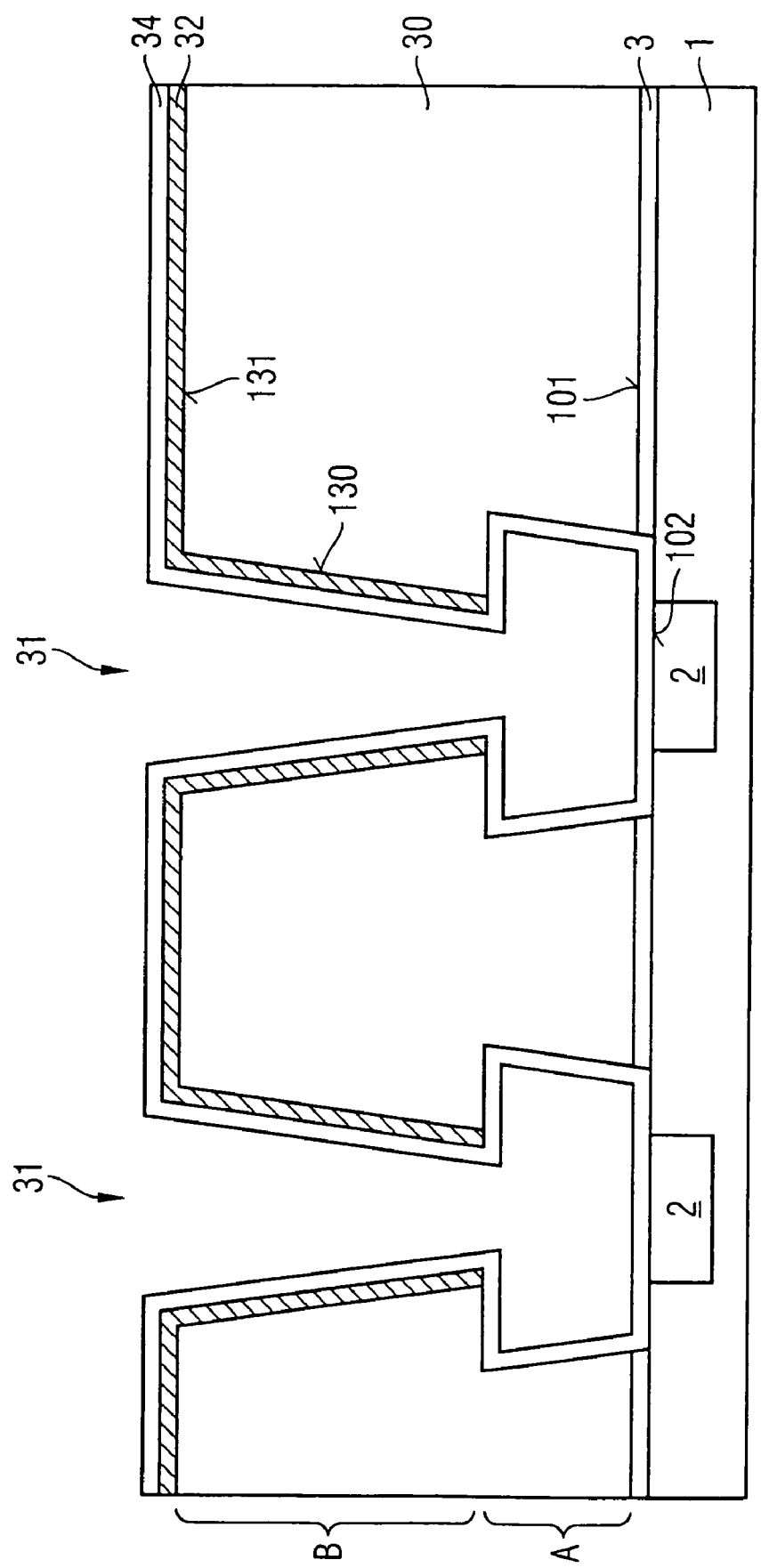
FIGS. 16 to 24 are local sections for illustrating gradually a method for forming a capacitor structure according to a second embodiment.

A second embodiment starts with the steps along with FIG. 1 to 6, of which the result is shown in FIG. 16. On a substrate 1 a dielectric mold 30 is applied. Vertical trenches 31 in the mold 30 are extending down to a substrate surface 101 of the substrate 1 and are arranged above contact pads 2 of the substrate 1. A first conductive layer 32 is deposited onto the side walls 110 of the trenches 11, but only in a top region B of the trenches 11. A first dielectric layer 34 covers the first conductive layer 32 and the side walls 110 of the trenches 11 in the bottom region, as well. The contact pads 2 are covered by the first dielectric layer 34. Optionally the bottom region A may have an enlarged diameter as result of an isotropic etching process.

Figure 17:
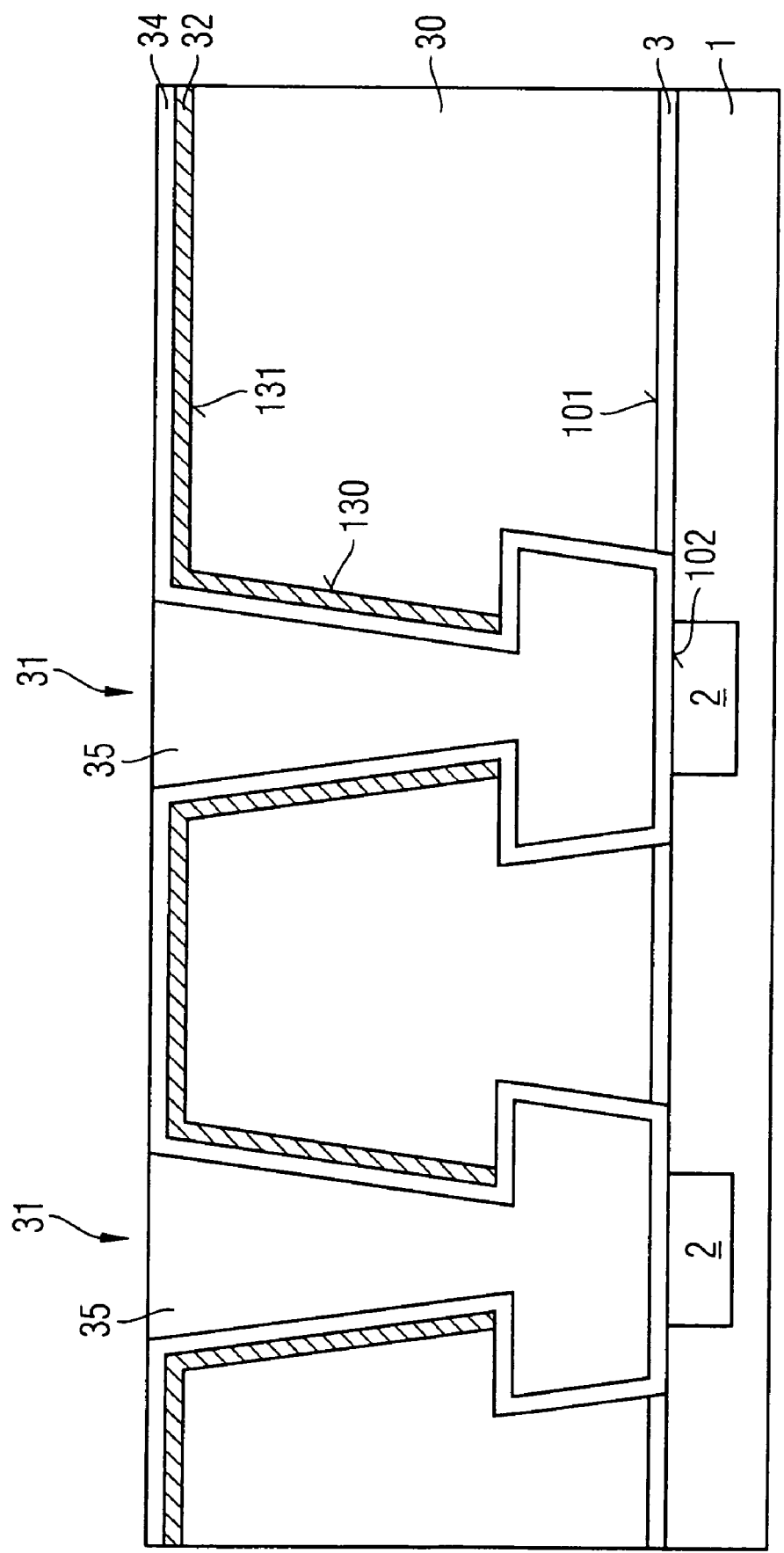

A sacrificial filling 35 is filled into the trench 31 (FIG. 17).

Figure 18:
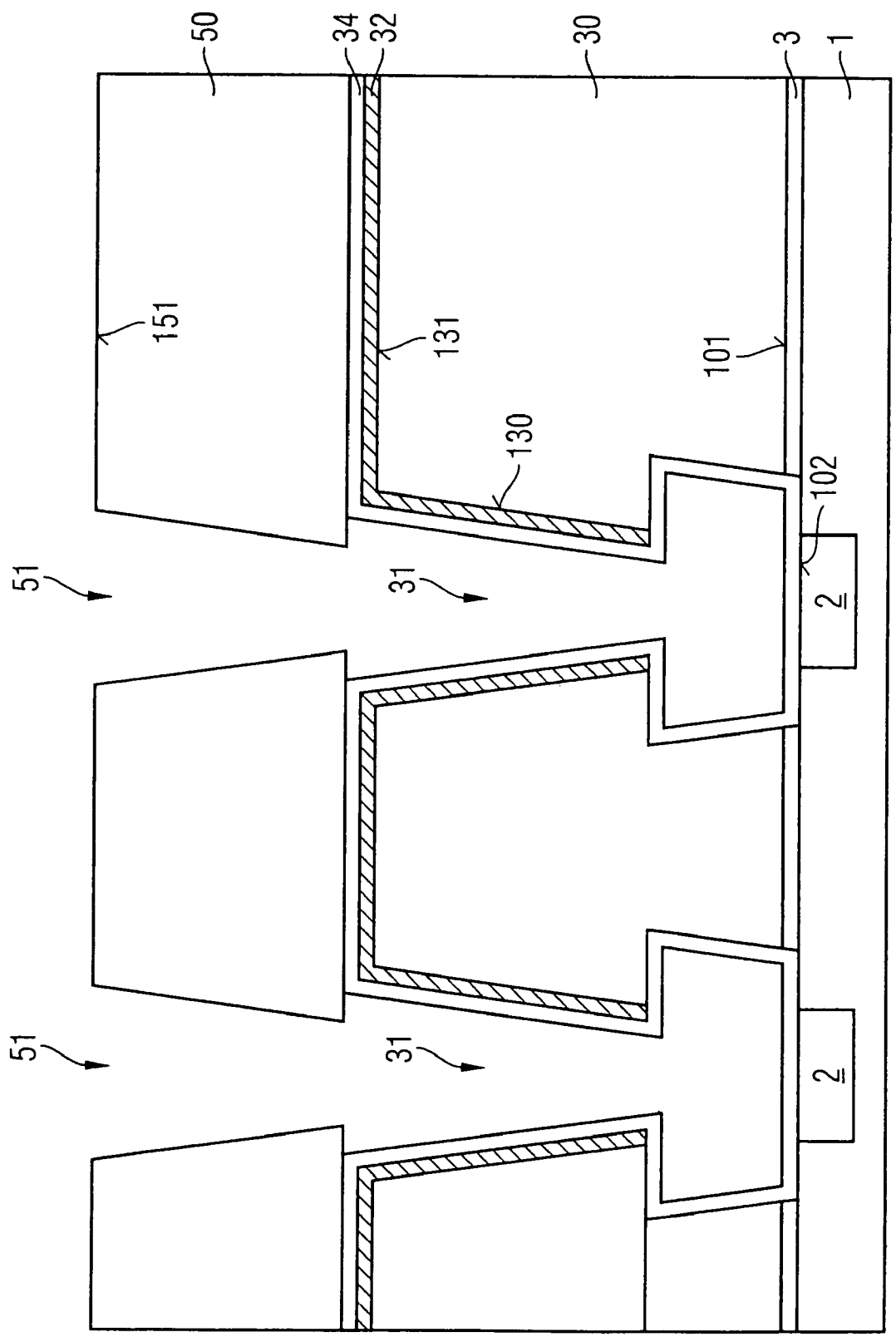

On top of the first dielectric mold 30 a second dielectric mold 50 is applied onto the second dielectric mold 30. Trenches 51 are formed above the contact pad into the second dielectric mold 30. Finally, the sacrificial filling is removed (FIG. 18). The manufactured structure shows now a second trench 51 which extends into a first trench 31.

Figure 19:
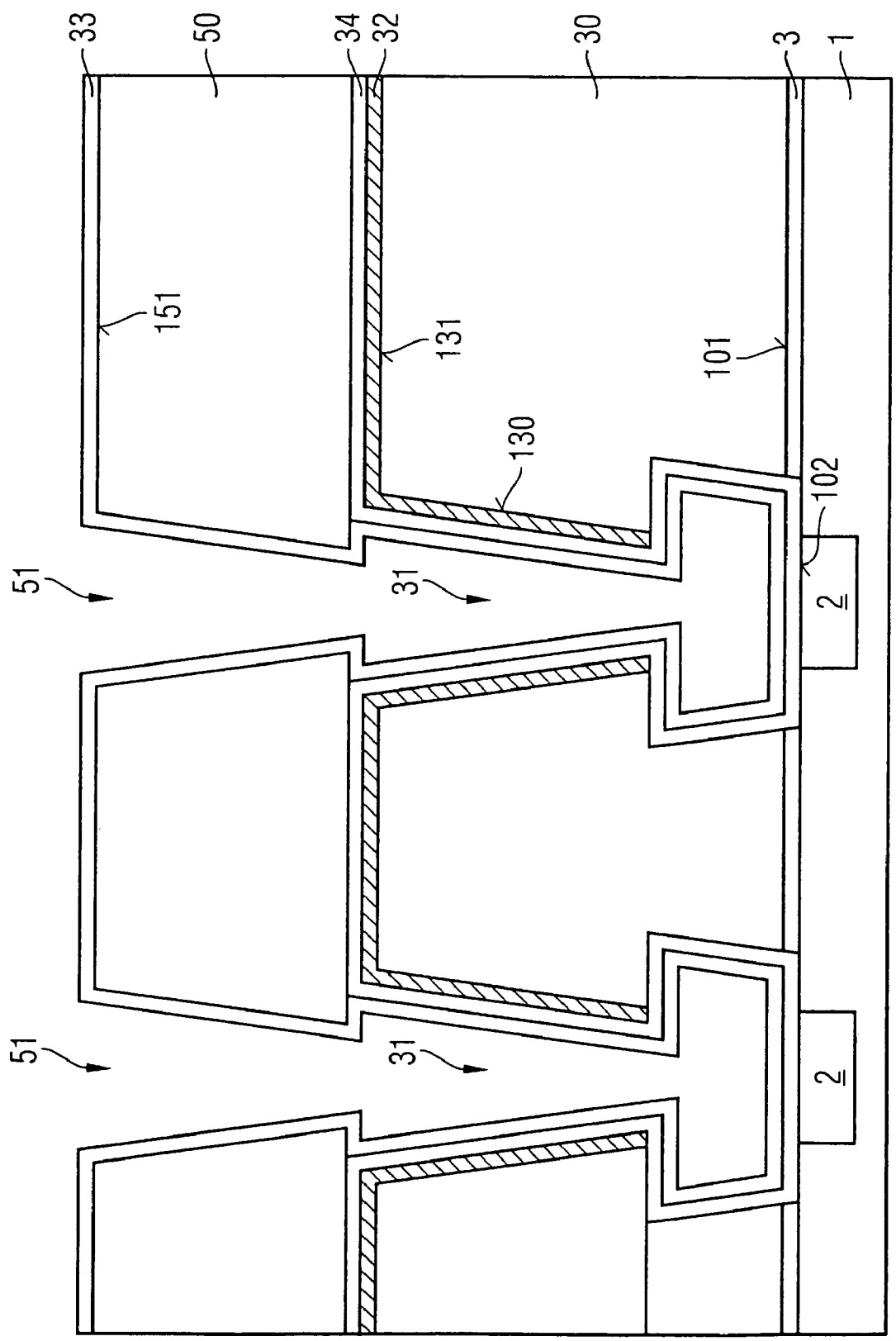
Figure 20:
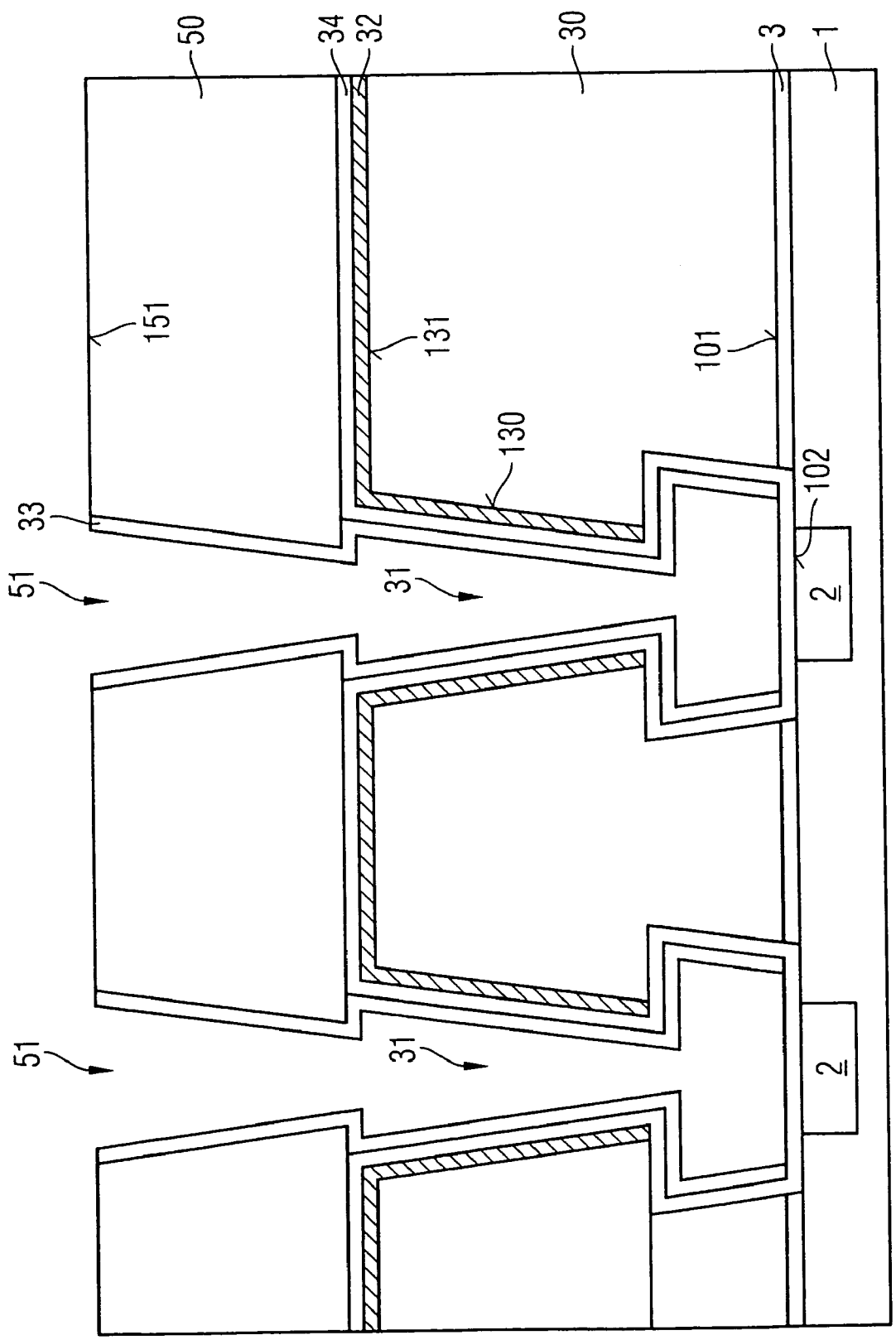

A sacrificial layer 33 is formed onto the top surface 151 of the second dielectric mold 50 and onto the surface 102 of the contact pad 2 (FIG. 19). The thickness of the sacrificial layer 33 may be inhomogeneous. In this case the thickness is preferably larger on top of the second dielectric mold 50 compared to the thickness on top of the contact pad 2.

Figure 21:
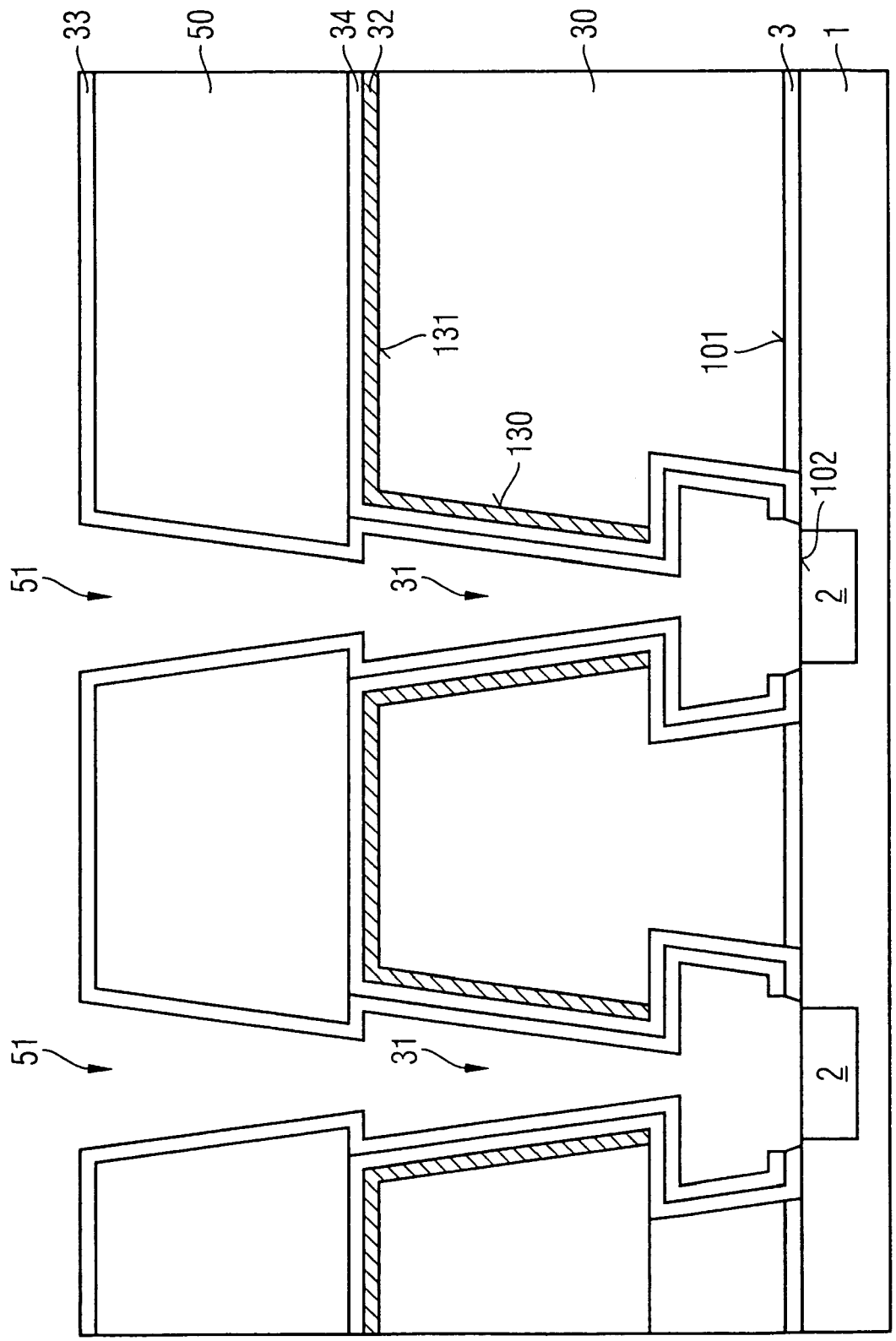
Figure 22:
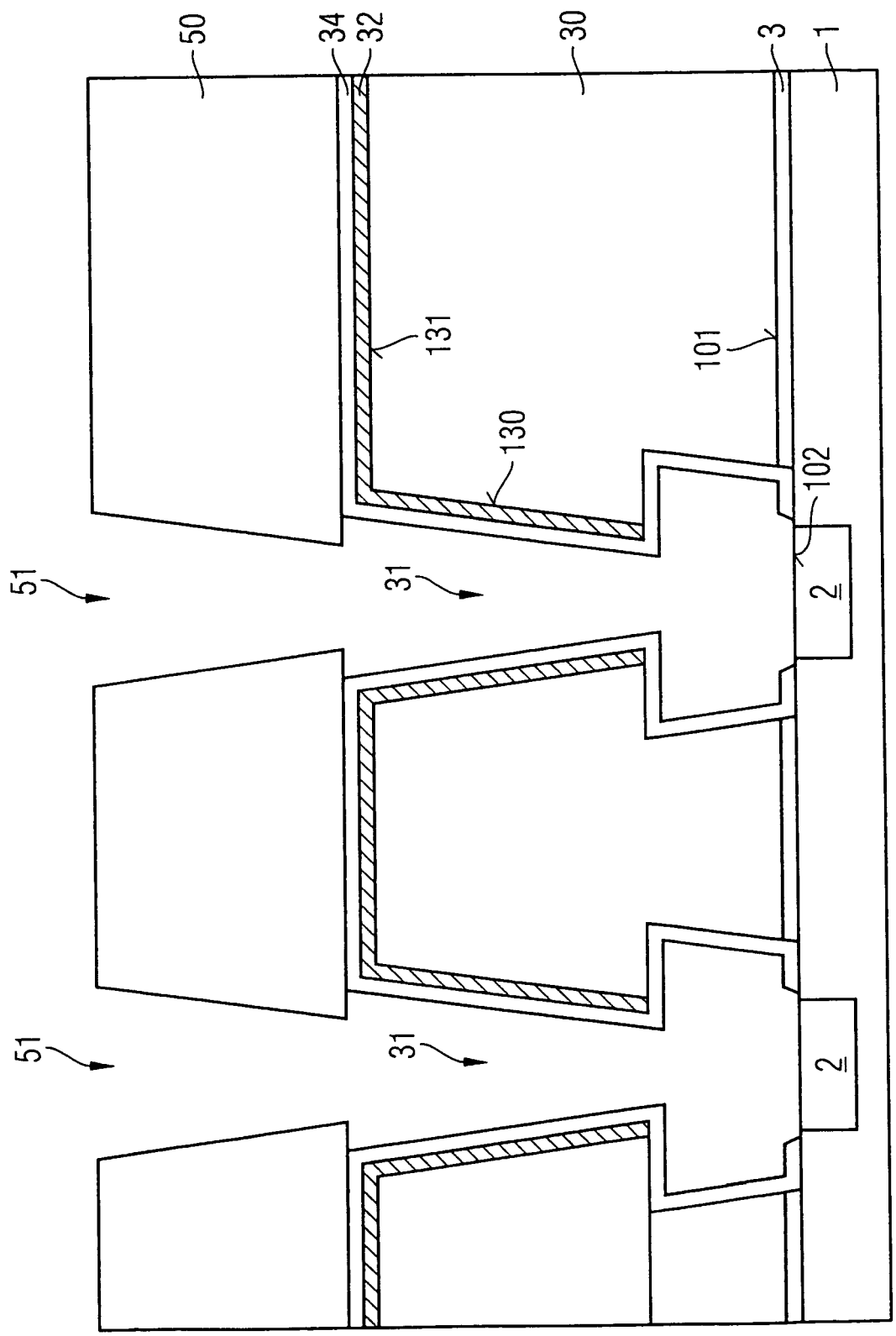

In a next step the sacrificial layer 33 is removed from the contact pad 2 by an anisotropic etching process (FIG. 20) leaving the first dielectric layer 34 exposed in the area around the contact pad 2. The sacrificial layer 33 will be removed from the top surface 151, as well, if the sacrificial layer 33 has a uniform thickness. The first dielectric layer 32 is selectively etched in the area of the contact pad 2, in order to expose the contact pad 2 (FIG. 21). The sacrificial layer 33 is removed (FIG. 22).

Figure 23:
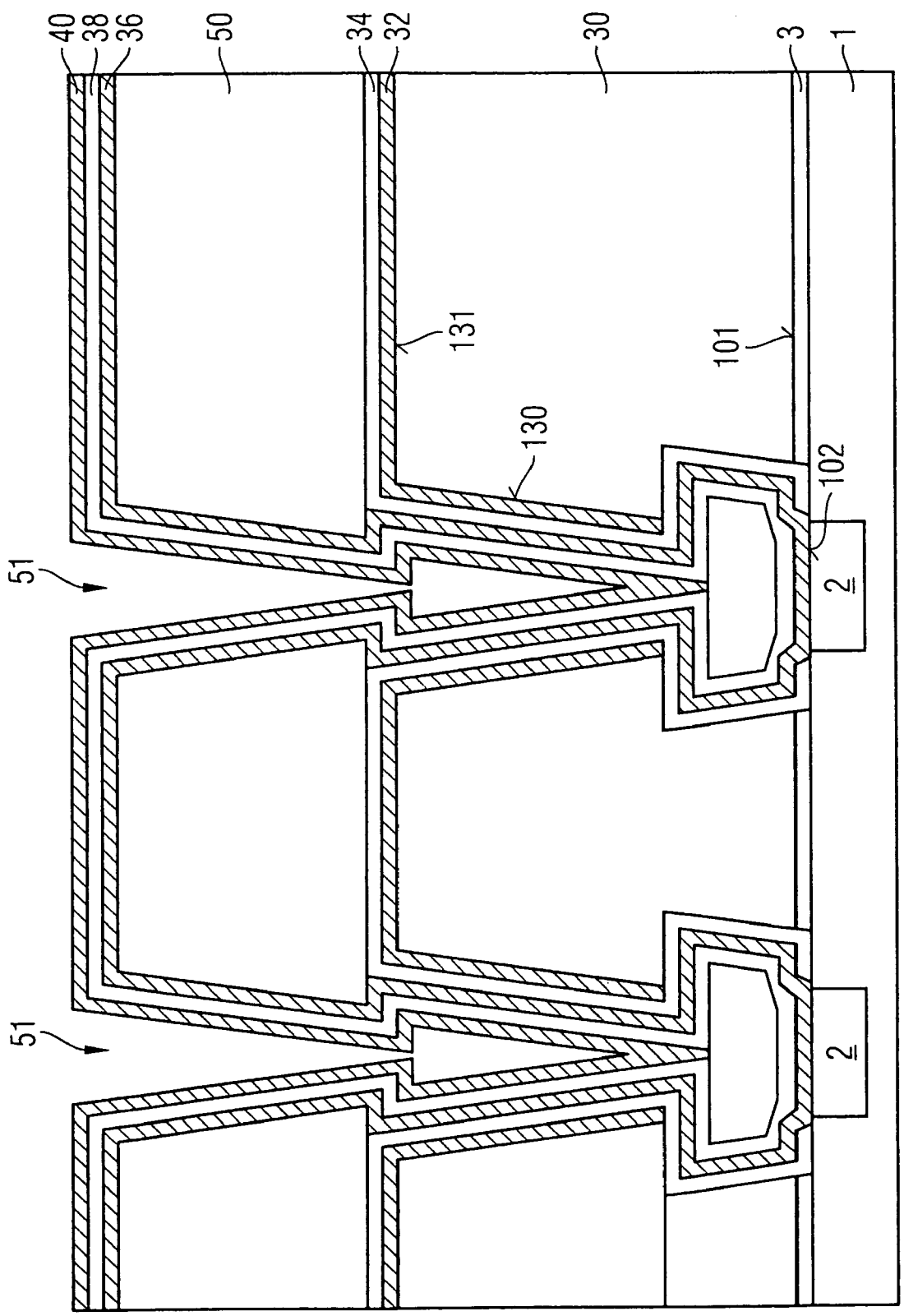
Figure 24:
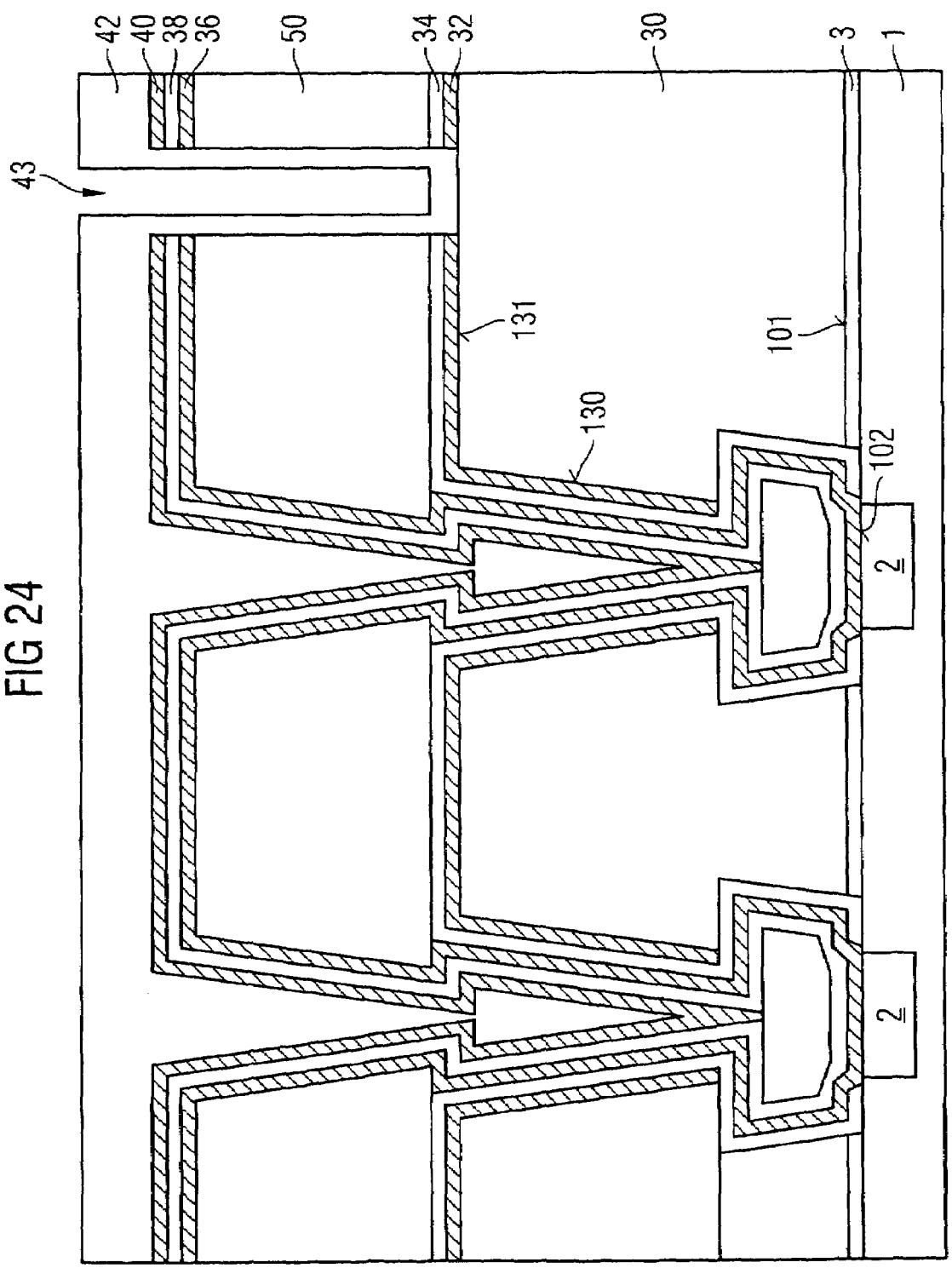

In subsequent steps a second conductive layer 36, a second dielectric layer 38 and a third conductive layer 40 are deposited (FIG. 23). The second conductive layer 36 is in electric contact with the contact pad 2.

In a last step a trench is formed beside the second trench 51 into the second dielectric mold 50. The trench extends down to the first conductive layer 32 on top of the first dielectric mold 30. The trench 43 becomes filled by a conductive material for forming a vertical plug 43. Thus, the first conductive layer 32 and the third conductive layer 28 are inter-connected by the vertical plug 43.

Figure 25:
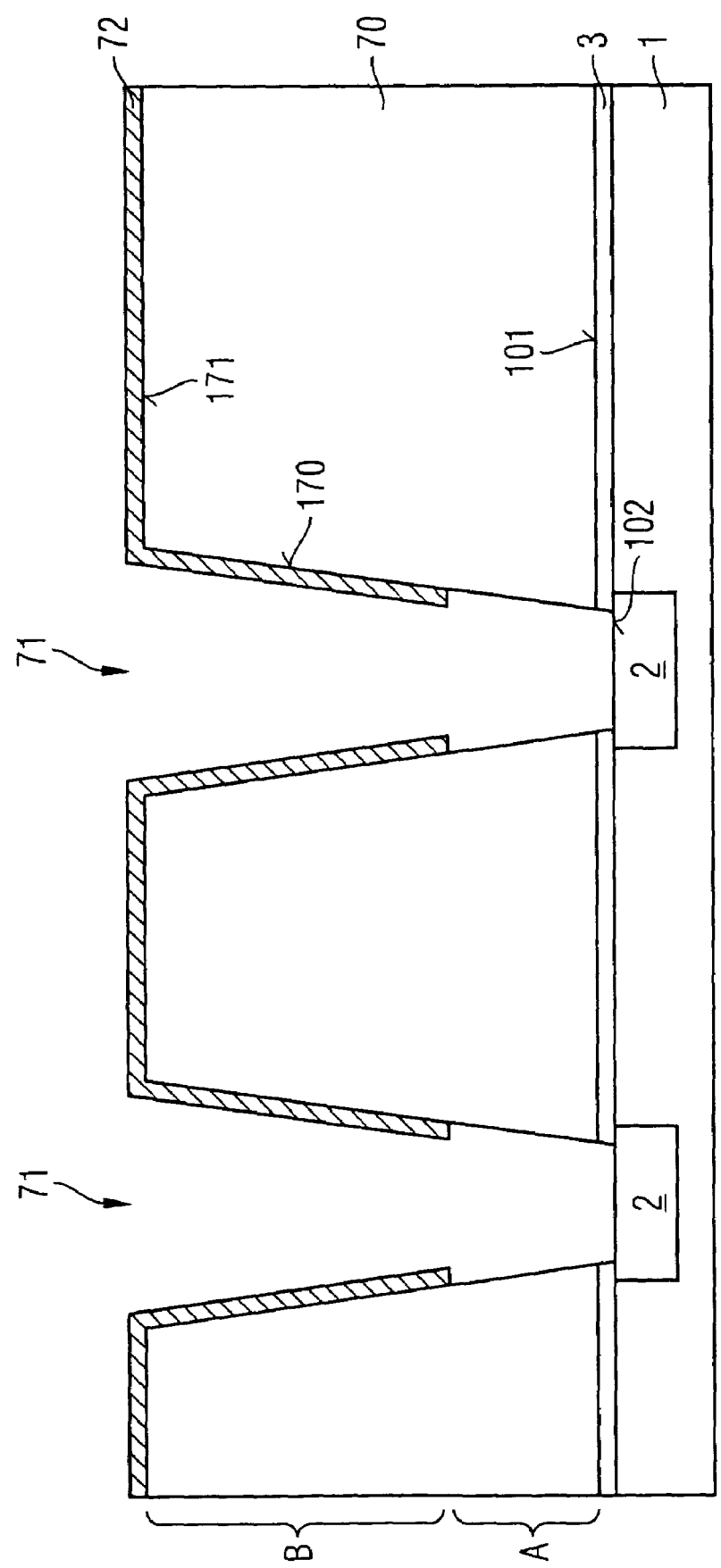
FIG. 25 is a local section for illustrating gradually a method for forming a capacitor structure according to a third embodiment.

In a third embodiment a substrate 1 is provided at which surface 101 contact pads 2 are arranged (FIG. 25). A dielectric mold 70 is deposited onto the surface substrate 101. Trenches 71 are formed into the dielectric mold 70. The depth of the trenches 71 is such that the dielectric mold 70 is at least partially removed from contact pads 2.

A first conductive layer 72 is deposited onto the dielectric mold 70 by a chemical deposition technique. The reaction conditions in a reaction chamber are chosen such that the reaction gases do not reach a bottom region A of the trench 11. Thus, a conductive layer 32 is only formed in the top region B of the trench 11. A preferred chemical deposition technique is the atomic layer deposition technique (ALD). The ALD allows a very controlled nonuniform deposition.

The further steps in order to form a capacitor structure are equal to the steps teached along with FIG. 5 to 15 or 16 to 24 and will not be repeated.

Although modifications and changes may be suggested by those skilled in the art, it is the intention of the inventor to embody within the patent warranted hereon all changes and modifications as reasonably and properly come within the scope of his contribution to the art.

What is claimed is:

1. A method for forming an integrated circuit having a capacitor structure:
    providing a substrate having a contact pad and a dielectric mold thereover, the dielectric mold comprising at least one trench therein, thereby leaving exposed the contact pad;
    forming a first conductive layer on side walls of the trench in a top region of the trench, the conductive layer not contacting the contact pad;
    forming a first dielectric layer over the first conductive layer;
    forming a second conductive layer on the contact pad, and on the side walls of the trench over the first dielectric layer;
    forming a second dielectric layer over the second conductive layer;
    forming a third conductive layer over the second dielectric layer; and
    electrically connecting the first conductive layer and the third conductive layer, wherein the forming of the first conductive layer comprises:
    depositing the first conductive layer;
    depositing a masking layer over the first conductive layer selectively in the top region of the trench, thereby not overlying a bottom region of the trench;
    etching the first conductive layer in the bottom region of the trench; and
    removing the masking layer.

2. The method according to claim 1, wherein the masking layer is formed by a chemical deposition method, at least one chemical reactant of the chemical deposition method having a concentration, which is decreased in the trench in a direction towards the contact pad and is approximately zero in the bottom region.

3. A method for forming an integrated circuit having a capacitor structure:
    providing a substrate having a contact pad and a dielectric mold thereover, the dielectric mold comprising at least one trench therein, thereby leaving exposed the contact pad;
    forming a first conductive layer on side walls of the trench in a top region of the trench, the conductive layer not contacting the contact pad;
    forming a first dielectric layer over the first conductive layer;
    forming a second conductive layer on the contact pad, and on the side walls of the trench over the first dielectric layer;
    forming a second dielectric layer over the second conductive layer;
    forming a third conductive layer over the second dielectric layer; and
    electrically connecting the first conductive layer and the third conductive layer,
    wherein before the first dielectric layer is formed, an isotropic etching step enlarges a diameter of a bottom region of the trench.

4. The method according to claim 3, wherein the first conductive layer is formed by a chemical deposition method, at least one chemical reactant of the chemical deposition method having a concentration, which is decreasing in the trench in a direction towards the contact pad and is approximately zero in the bottom region.

5. The method according to claim 3, wherein before the second conductive layer is deposited the following steps are executed:
  forming a sacrificial layer over the first dielectric layer, the sacrificial layer having a first thickness above the contact pad in the trench and a second thickness above the dielectric mold outside the trench, the first thickness being smaller than the second thickness;
  anisotropically etching the sacrificial layer until the sacrificial layer is removed above the contact pad, thereby exposing the first dielectric layer overlying the contact pad in the trench; and
  selectively etching the exposed first dielectric layer, thereby exposing the contact pad.

6. The method according to claim 5, wherein the sacrificial layer is formed by a chemical deposition method, at least one chemical reactant of the chemical deposition method having a concentration, which is decreasing in the trench in a direction towards the contact pad and is approximately zero in the bottom region.

7. The method according to claim 3, wherein the second conductive layer is removed from a top surface of the dielectric mold outside the trench.

8. The method according to claim 7, wherein the second conductive layer is removed by a chemical polishing method.

9. The method according to claim 3, wherein before the second conductive layer is deposited a further dielectric mold having a further trench is formed on top of the dielectric mold, the further trench being arranged vertically in line to the trench.

10. The method of claim 3, wherein electrically connecting the first and third conductive layers comprises forming a vertical conductive plug that interconnects the first and third conductive layers.

11. The method according to claim 10, wherein the vertical plug is formed through a further dielectric mold for connecting the first conductive layer and the third conductive layer.

* * * * *